United States Patent
Onaka et al.

(10) Patent No.: US 10,359,478 B2
(45) Date of Patent: Jul. 23, 2019

(54) MAGNETIC SENSOR

(71) Applicant: Panasonic Intellectual Property Management Co., Ltd., Osaka (JP)

(72) Inventors: Kazuhiro Onaka, Hyogo (JP); Noritaka Ichinomiya, Nara (JP); Shigehiro Yoshiuchi, Kyoto (JP); Kiyotaka Yamada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 87 days.

(21) Appl. No.: 15/554,427

(22) PCT Filed: Apr. 26, 2016

(86) PCT No.: PCT/JP2016/002198
§ 371 (c)(1),
(2) Date: Aug. 30, 2017

(87) PCT Pub. No.: WO2016/185676
PCT Pub. Date: Nov. 24, 2016

(65) Prior Publication Data
US 2018/0052208 A1 Feb. 22, 2018

(30) Foreign Application Priority Data

May 15, 2015 (JP) .................. 2015-099588
May 18, 2015 (JP) .................. 2015-100782
(Continued)

(51) Int. Cl.
*G01R 33/00* (2006.01)
*G01R 33/07* (2006.01)
(Continued)

(52) U.S. Cl.
CPC ......... *G01R 33/0005* (2013.01); *G01D 5/145* (2013.01); *G01R 33/07* (2013.01); *G01R 33/09* (2013.01)

(58) Field of Classification Search
CPC .... G01R 33/0005; G01R 33/07; G01R 33/09; G01D 5/145
See application file for complete search history.

(56) References Cited

U.S. PATENT DOCUMENTS

2009/0295375 A1    12/2009   Oohira
2010/0321010 A1*   12/2010   van Veldhoven ...... B82Y 25/00
                                                    324/225
(Continued)

FOREIGN PATENT DOCUMENTS

DE    19839450 B       3/2004
JP    2006-208025      8/2006
(Continued)

OTHER PUBLICATIONS

International Search Report of PCT application No. PCT/JP2016/002198 dated Jun. 7, 2016.

*Primary Examiner* — Daniel R Miller
(74) *Attorney, Agent, or Firm* — McDermott Will & Emery LLP

(57) ABSTRACT

A magnetic sensor includes a first magnetoresistive element that detects a magnetic field along a first detection axis, a second magnetoresistive element that detects a magnetic field along a second detection axis inclining at an angle of 45 degrees with respect to the first detection axis, a first Hall element that detects a magnetic field along a third detection axis, and a second Hall element that detects a magnetic field along a fourth detection axis perpendicular to the third detection axis. This magnetic sensor has both characteristics
(Continued)

of the Hall elements and characteristics of the magnetoresistive elements, and has high accuracy and a small size.

15 Claims, 32 Drawing Sheets

(30) Foreign Application Priority Data

May 19, 2015 (JP) ................................. 2015-101857
Jun. 17, 2015 (JP) ................................. 2015-121614

(51) Int. Cl.
*G01R 33/09* (2006.01)
*G01D 5/14* (2006.01)

(56) References Cited

U.S. PATENT DOCUMENTS

2011/0025318 A1  2/2011  Saruki et al.
2012/0262155 A1  10/2012  Donovan et al.

FOREIGN PATENT DOCUMENTS

| JP | 2007-132742 | 5/2007 |
| JP | 2011-027683 | 2/2011 |
| JP | 4940965 B | 5/2012 |
| JP | 2013-024674 | 2/2013 |
| JP | 2014-512012 | 5/2014 |

\* cited by examiner

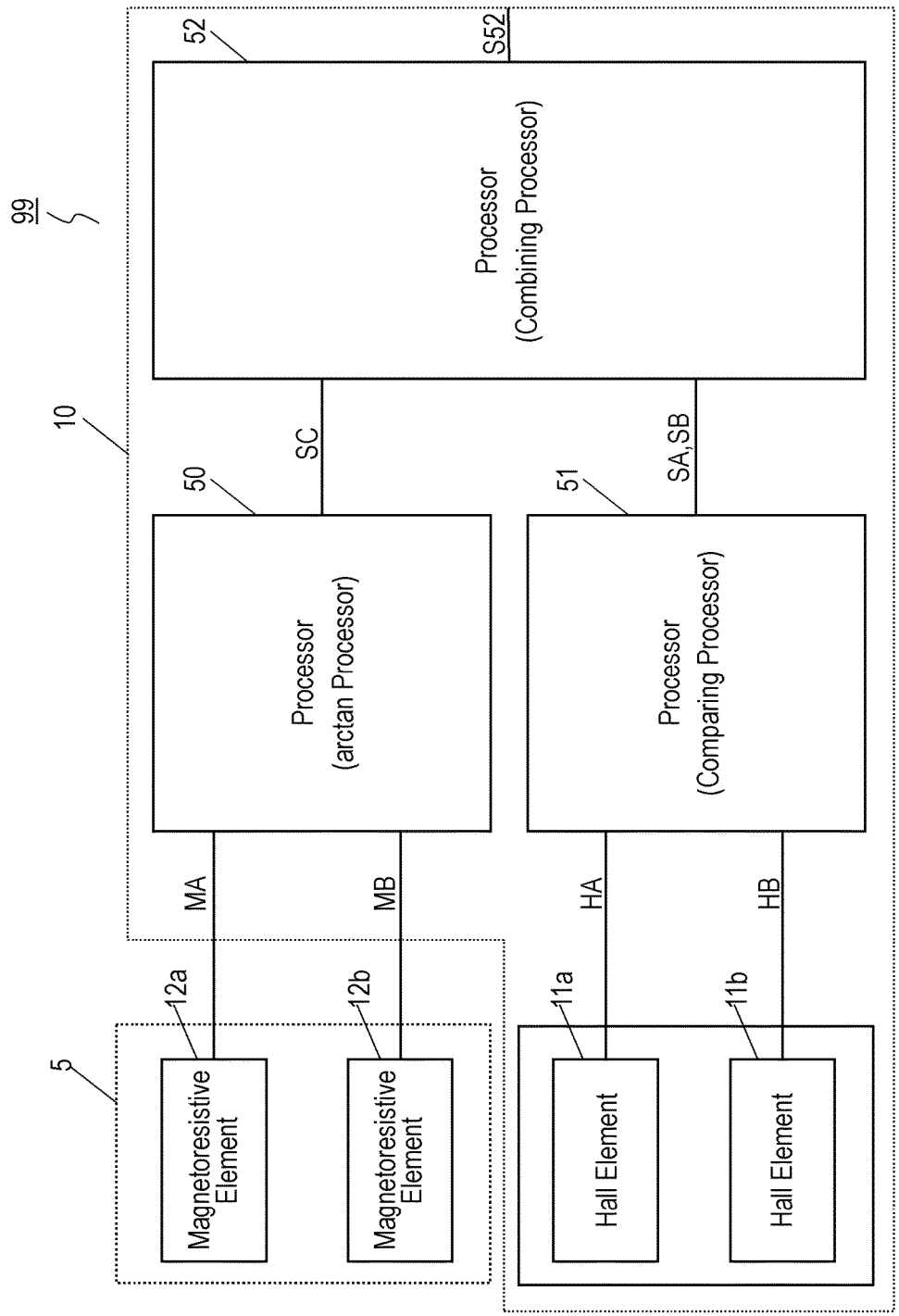

MAGNETIC SENSOR

CROSS-REFERENCE TO RELATED APPLICATIONS

This application is a U.S. national stage application of the PCT international application No.PCT/JP2016/002198 filed on Apr. 26, 2016, which claims the benefit of foreign priority of Japanese patent application No. 2015-099588 filed on May 15, 2015, Japanese patent application No. 2015-100782 filed on May 18, 2015, Japanese patent application No. 2015-101857filed on May 19, 2015, and Japanese patent application No. 2015-121614 filed on Jun. 17, 2015, the contents all of which are incorporated herein by reference.

TECHNICAL FIELD

The present invention relates to a magnetic sensor including a magnetoresistive element.

BACKGROUND ART

PTL 1 discloses a magnetic sensor including different kinds of magnetoresistive elements. In the magnetic sensor, a Hall element and a magnetoresistive element are disposed on a single semiconductor substrate to combine characteristics of the Hall element and characteristics of the magnetoresistive element. This configuration allows the sensor to detect an angle.

PTL 2 discloses a magnetic sensor including a magnetoresistive element made of a magnetic resistance pattern having plural turning portions.

PTL 3 discloses a magnetic sensor detecting changes in an external magnetic field based on changes in resistance of plural magnetoresistive elements.

PTL 4 discloses a magnetic sensor including a bias magnet disposed directly under four magnetoresistive elements. PTL 5 discloses a magnetic sensor including a bias magnet covering an upper part of a magnetoresistive element.

CITATION LIST

Patent Literature

PTL 1: Japanese Patent No. 4940965
PTL 2: German Patent No. 19839450
PTL 3: Japanese Patent Laid-Open Publication No. 2011027683
PTL 4: Japanese Patent Laid-Open Publication No. 2006-208025
PTL 5: Japanese Patent Laid-Open Publication No. 2013-024674

SUMMARY

A magnetic sensor includes a first magnetoresistive element that detects a magnetic field along a first detection axis, a second magnetoresistive element that detects a magnetic field along a second detection axis inclining at an angle of 45 degrees with respect to the first detection axis, a first Hall element that detects a magnetic field along a third detection axis, and a second Hall element that detects a magnetic field along a fourth detection axis perpendicular to the third detection axis.

This magnetic sensor has both characteristics of the Hall elements and characteristics of the magnetoresistive elements, and has high accuracy and a small size.

BRIEF DESCRIPTION OF DRAWINGS

FIG. 3 is an electrical diagram of the magnetic sensor according to Embodiment 1.

DETAIL DESCRIPTION OF PREFERRED EMBODIMENTS

Figure 1A:
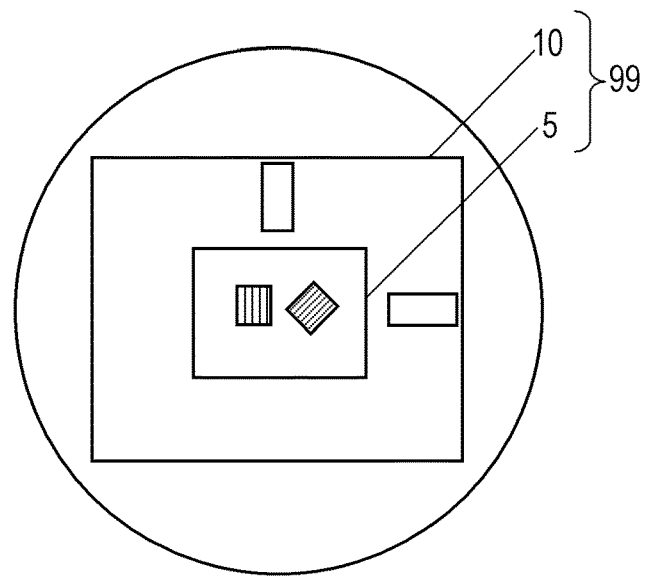
FIG. 1A is a top view of a magnetic sensor according to Exemplary Embodiment 1.

Hereinafter, magnetic sensors according to embodiments will be described with reference to the accompanying drawings. The same reference numerals and symbols for designating the same parts throughout the drawings are sometimes omitted, and their explanations may also be omitted. Moreover, each of the drawings is intended to show an example of preferred embodiments; therefore, any of the configurations, shapes, numerals, and the like used to show the example should not be construed as limiting the embodiments. Furthermore, it is possible to optionally combine elemental technologies to be described in the embodiments provided that no contradiction arises.

Figure 1B:
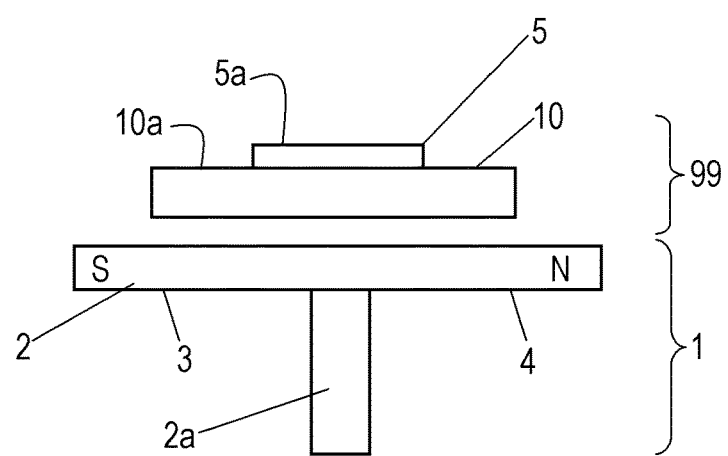
FIG. 1B is a side view of the magnetic sensor shown in FIG. 1A.

FIG. 1A is a top view of magnetic sensor 99 according to Exemplary Embodiment 1. FIG. 1B is a side view of magnetic sensor 99.

Magnetic sensor 99 includes substrate 5 serving as a sensor chip and substrate 10 serving as a circuit substrate. Substrate 5 has upper surface 5a. Substrate 10 has upper surface 10a. Substrate 5 is disposed on upper surface 10a of substrate 10. Magnetic sensor 99 is configured to detect a magnetic field generated by object 1. In accordance with Embodiment 1, object 1 is a magnet rotor. Object 1 includes rotor body 2 and rotary shaft 2a coupled with rotor body 2. Rotor body 2 includes S-pole permanent magnet 3 and an N-pole permanent magnet 4. Substrate 5 is disposed at a position facing both S-pole permanent magnet 3 and N-pole permanent magnet 4. S-pole permanent magnet 3 and N-pole permanent magnet 4 apply a magnetic field to substrate. The magnetic field is in parallel with upper surface 5a, i.e. the surface of substrate 5. Substrate 5 is connected to substrate 10 with metal wires. Substrate 10 is disposed on a die pad. Terminals are coupled with the die pad. Substrate 5 includes with a magnetic medium (bias magnet).

Figure 2:
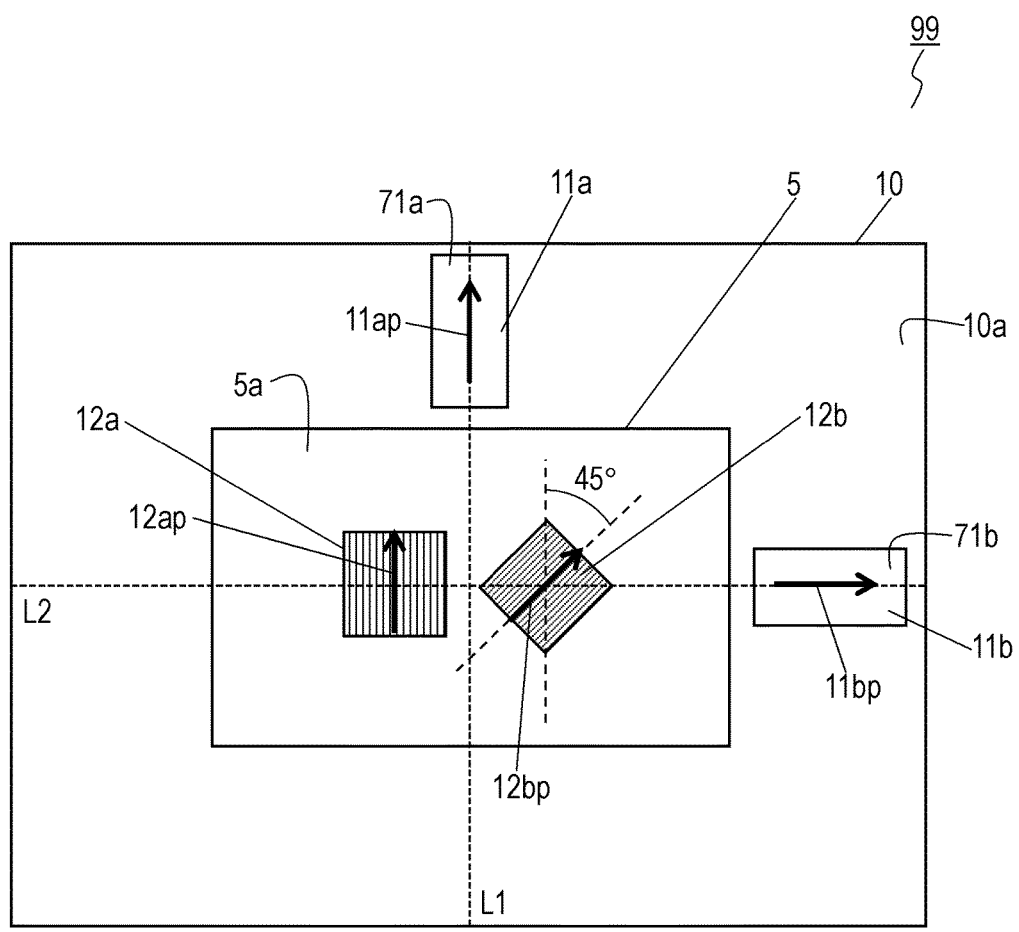
FIG. 2 is a top view of the magnetic sensor according to Embodiment 1.

FIG. 2 is a top view of magnetic sensor 99.

Substrate 5 includes magnetoresistive elements 12a and 12b.

Substrate 10 includes Hall elements 11a and 11b.

Magnetoresistive elements 12a and 12b are disposed on upper surface 5a of substrate 5. Hall elements 11a and 11b has magnetic sensitive surfaces 71a and 71b, respectively, that serves as Hall plates at each of which a Hall voltage becomes largest. Magnetic sensitive surfaces 71a and 71b of Hall elements 11a and 11b are parallel with upper surface 5a of substrate 5 on which magnetoresistive elements 12a and 12b are disposed.

In other words, Hall elements 11a and 11b are vertical Hall elements.

Hall elements 11a and 11b detect magnetic fields parallel with upper surface 10a of substrate 10.

Hall element 11b is disposed to be rotated at an angle of 90 degrees with respect to Hall element 11a. This configuration provides a phase difference of 90 degrees between changes in output voltages of Hall elements 11a and 11b which are caused due to a rotation of object 1.

Hall element 11a detects a magnetic field along detection axis 11ap parallel with upper surface 10a of substrate 10. In detail, Hall element 11a exhibits a higher sensitivity to a magnetic field along detection axis 11ap than to a magnetic field along any axis that is not in parallel with detection axis 11ap. Similarly, Hall element 11b detects a magnetic field along detection axis 11bp that is in parallel with upper surface 10a of substrate 10 and is perpendicular to detection axis 11ap. In detail, Hall element 11b exhibits a higher sensitivity to the magnetic field along detection axis 11bp than to a magnetic field along any axis that is not in parallel with detection axis 11bp.

That is, virtual lines L1 and L2 perpendicular to each other passing substantially through the center of substrate 5 are defined. Hall element 11a is disposed on virtual line L1 while Hall element 11b is disposed on virtual line L2.

Hall elements 11a and 11b do not overlap substrate 5 viewing from above.

Magnetoresistive elements 12a and 12b have resistances that changes in accordance with intensity of the magnetic field in parallel with upper surface 5a of substrate 5. Magnetoresistive elements 12a and 12b output voltage signals having values in accordance with the resistances.

Each of magnetoresistive elements 12a and 12b includes a pattern having plural strip shapes of thin films made of NiFe.

Magnetoresistive element 12b is disposed rotated at an angle of 45 degrees with respect to magnetoresistive element 12a. This configuration provides a phase difference of 45 degrees between changes in output voltages of magnetoresistive elements 12b and 12a caused by the rotation of object 1.

Magnetoresistive element 12a detects a magnetic field along detection axis 12ap parallel with upper surface 5a of substrate 5. In detail, magnetoresistive element 12a exhibits a higher sensitivity to the magnetic field along detection axis 12ap than to a magnetic field along any axis which is not in parallel with detection axis 12ap. Similarly, magnetoresistive element 12b detects a magnetic field along detection axis 12bp that is parallel with upper surface 5a of substrate 5 and inclines at an angle of 45 degrees with respect to rotating detection axis 12ap. In detail, magnetoresistive element 12b exhibits a higher sensitivity to the magnetic field along detection axis 12bp than to a magnetic field along any axis which is not in parallel with detection axis 12bp.

Magnetoresistive elements 12a and 12b are preferably disposed at closest possible positions to each other on upper surface 5a of substrate 5.

Upon having a magnetic field that contains a component parallel to upper surface 5a of substrate 5, i.e. upper surface 10a of substrate 10 applied, Hall elements 11a and 11b generate Hall voltages corresponding to the applied magnetic field by the Hall effect. The Hall voltages are detected so as to determine the magnetic field component parallel with the surface of substrate 5 (i.e. the surface of substrate 10).

FIG. 3 is an electrical diagram of magnetic sensor 99.

Substrate 10 further includes processor 50, processor 51, and processor 52.

An operation of magnetic sensor 99 will be described below. FIGS. 4A to 4E illustrate signals of magnetic sensor 99.

Figure 4A:
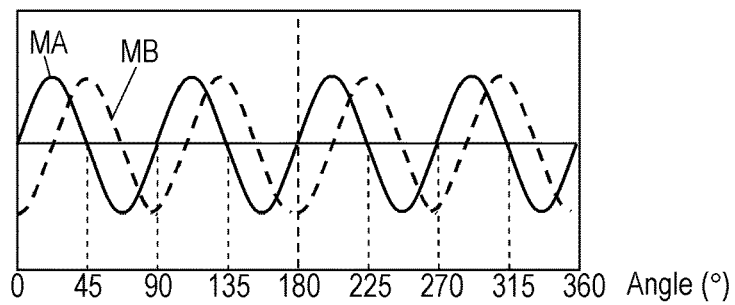
FIG. 4A illustrates signals of the magnetic sensor according to Embodiment 1.

Magnetoresistive element 12a outputs signal MA that is a voltage in accordance with the resistance of magnetoresistive element 12a. Magnetoresistive element 12b outputs signal MB that is a voltage in accordance with the resistance of magnetoresistive element 12b. FIG. 4A shows signals MA and MB which are output from magnetoresistive element 12a and 12b, respectively. In FIG. 4A, the vertical axis represents values of signals MA and MB, and the horizontal axis represents a rotation angle of rotary shaft 2a of object 1, i.e. the magnet rotor. Processor 50 performs arctangent calculations on both signal MA obtained from magnetoresistive element 12a and signal MB obtained from magnetoresistive element 12b.

An example of a computing type of the arctangent calculations will be described below.

First, analogue values of signals MA and MB are subjected to analog-to-digital (AD) conversion to be converted into digital values, and are then subjected to adjustment of gain and offset, thereby being normalized. Specifically, firstly, data of digital values are acquired by detecting signals MA and MB that are the outputs generated in response to one or more cycles of a rotation angle not smaller than 360 degrees. As shown in FIG. 4A, amplitudes of signals MA and MB are coincide with each other by causing the magnitudes of the digital values to be equal to a predetermined value, and offset centers of the phases to be equal to a predetermined value. After that, signal MA (sine output) is divided by signal MB (cosine output) to obtain an arctangent value.

Figure 4B:
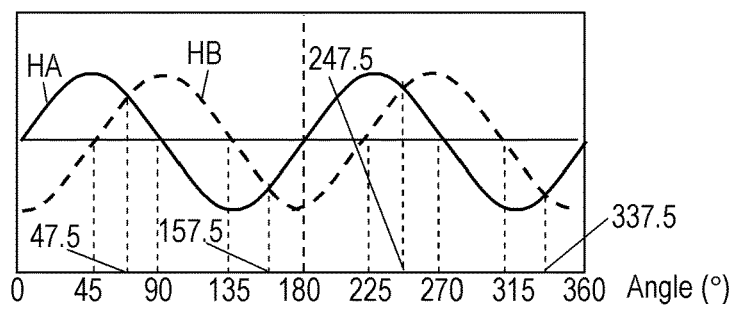
FIG. 4B illustrates signals of the magnetic sensor according to Embodiment 1.

Hall elements 11a and 11b detect the magnetic fields along detection axes 11ap and 11bp parallel with magnetic sensitive surfaces 71a and 71b, and then, output signals HA and HB, respectively. FIG. 4B shows signals HA and HB output from Hall elements 11a and 11b, respectively. In FIG. 4B, the vertical axis represents values of signals MA and MB, and the horizontal axis represents the rotation angle of rotary shaft 2a of object 1, i.e. the magnet rotor.

Processor 52 (combing processor) are connected to processors 50 and 51.

Processor 52 combines the outputs of processors 50 and 51.

The output of processor 52 is a linear signal in a range of rotation angles from 0 (zero) to 360 degrees. An operation of magnetic sensor 99 will be described below.

Signal MA and signal MB forms a sine curve and a cosine curve, respectively, that are produced in accordance with the changes in the resistances of magnetoresistive element 12a and magnetoresistive element 12b in response to the rotation angle. One output signal MA of output signals MA and MB has a phase difference of 45 degrees with respect to another output signal MB of output signals MA and MB. The resistances of magnetoresistive elements 12a and 12b do not allow the N-pole and the S-pole of permanent magnets 3 and 4 to be discriminated, and change in accordance with the intensity, without polarity, of the magnetic field. For this reason, when object 1 shown in FIG. 4B rotates to rotate S-pole permanent magnet 3 and N-pole permanent magnet 4 which generate the magnetic field, each of the sine and cosine curves is output in two cycles of the rotation angle ranging from 0 (zero) to 360 degrees, as shown in FIG. 4A.

Figure 4C:
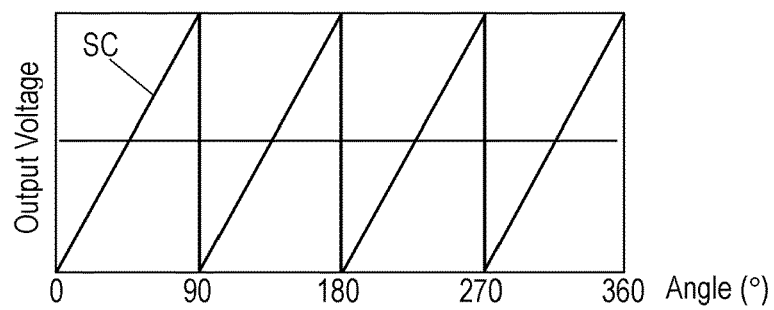
FIG. 4C illustrates a signal of the magnetic sensor according to Embodiment 1.

On the other hand, Hall elements 11a and 11b allow S-pole permanent magnet 3 and N-pole permanent magnet 4 to be discriminated. For this reason, each of signal HA and signal HB is output in one cycle of the rotation angle ranging from 0 (zero) to 360 degrees, as shown in FIG. 4B. Processor 50 performs an arctangent calculation to divide signal MB by signal MA to output signal SC. FIG. 4C shows signal SC output from processor 50. In FIG. 4C, the vertical axis represents values of signal SC, and the horizontal axis represents the rotation angle of rotary shaft 2a of object 1, i.e. the magnet rotor.

Figure 4D:
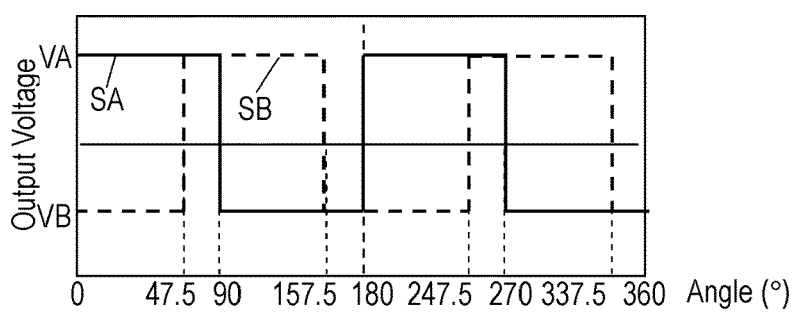
FIG. 4D illustrates signals of the magnetic sensor according to Embodiment 1.

Processor 51 (comparing processor) is connected to Hall elements 11a and 11b. Processor 51 converts output signal HA of Hall element 11a and output signal HB of Hall element 11b into a comparison output, and outputs the comparison output. Specifically, in accordance with Embodiment 1, processor 51 outputs signal SA which has value VA when the value of signal HA output from Hall element 11a is not smaller than 0 (zero) and has value VB when the value of signal HA is smaller than 0 (zero). Processor 51 outputs signal SB which has value VA when the value of signal HB output from Hall element 11b is not smaller than the value of signal HA and has value VB when the value of signal HB is smaller than the value of signal HA. FIG. 4D shows signals SA and SB. In FIG. 4D, the vertical axis represents values of signals SA and SB, and the horizontal axis represents the rotation angle of rotary shaft 2a of object 1, i.e. the magnet rotor.

Signals SA and SB shown in FIG. 4D can determine which one of an angle ranging from 0 (zero) to 180 degrees and an angle ranging from 180 to 360 degrees is indicated by signals MA and MB detected and output by magnetoresistive elements 12a and 12b.

Figure 4E:
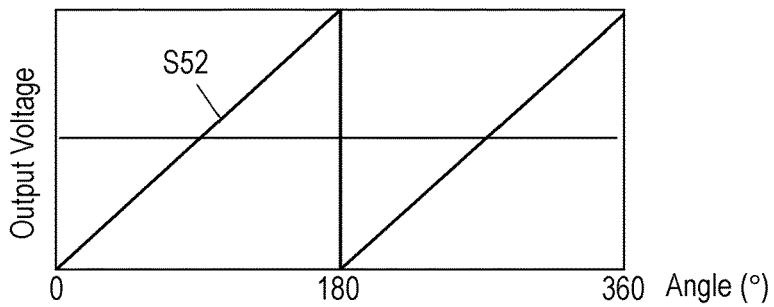
FIG. 4E illustrates a signal of the magnetic sensor according to Embodiment 1.

Processor 52 combines signal SC, signal SA, and signal SB to produce and output signal S52. FIG. 4E illustrates signal S52. In FIG. 4E, the vertical axis represents values of signal S52, and the horizontal axis represents the rotation angle of rotary shaft 2a of object 1, i.e. the magnet rotor. As shown in FIG. 4E, signal S52 is a linear signal within a range of rotation angles from 0 (zero) to 360 degrees.

The above configuration provides inexpensive and accurate magnetic sensor 99. Substrate 5 including magnetoresistive elements 12a and 12b and substrate 10 including Hall elements 11a and 11b are separate from each other, enhancing productivity of magnetic sensor 99.

In the magnetic sensor disclosed in PTL 1, a magnetoresistive element has a complex pattern of a thin-film metal resistor having a lot of bending, accordingly providing a lower yield rate than a Hall element. As a result, the low yield rate of the magnetoresistive element reduces productivity of the magnetic sensor.

Figure 5:
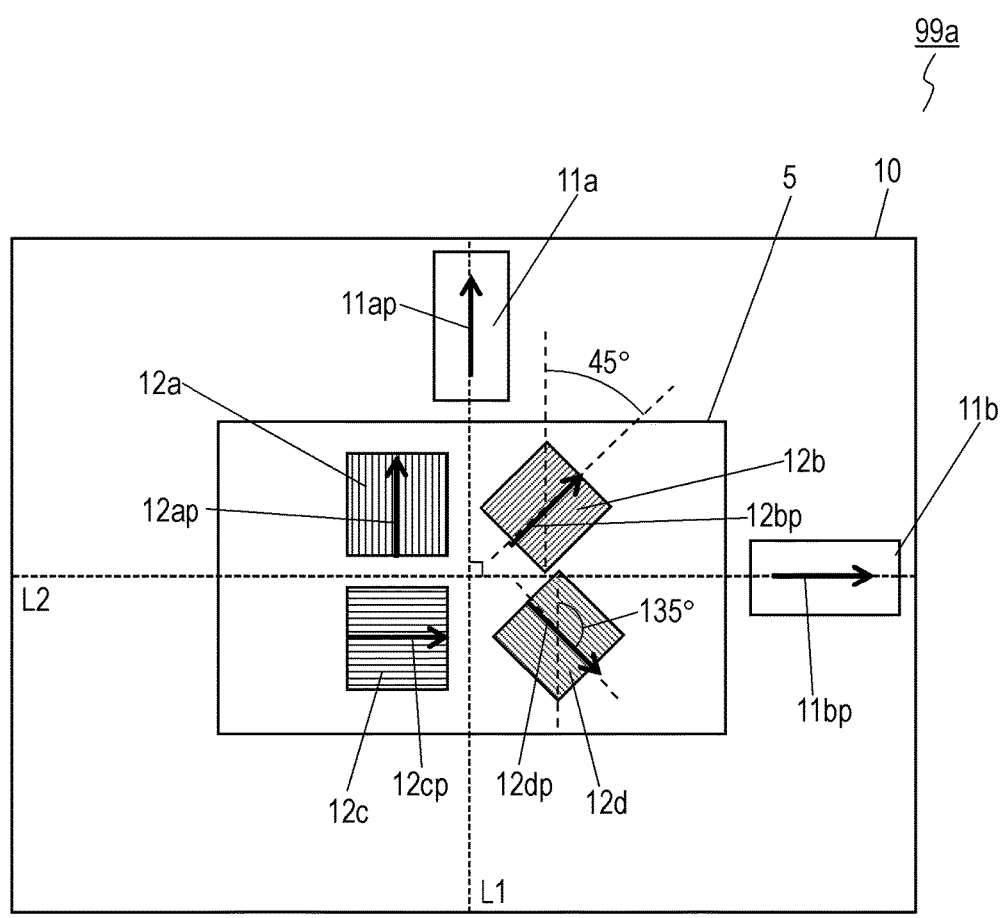
FIG. 5 is a top view of another magnetic sensor according to Embodiment 1.

FIG. 5 is a top view of another magnetic sensor 99a according to Embodiment 1. In FIG. 5, components identical to those of magnetic sensor 99 shown in FIG. 2 are denoted by the same numerals. Magnetic sensor 99a further includes magnetoresistive elements 12c and 12d in addition to the magnetoresistive elements disposed on upper surface 5a of substrate 5 of magnetic sensor 99 shown in FIG. 2. These additional elements provide twice larger magnitude of the output from the magnetoresistive elements than that without the additional elements.

Substrate 5 includes magnetoresistive elements 12a and 12b.

Substrate 10 includes Hall elements 11a and 11b.

Similarly to magnetoresistive elements 12a and 12b, magnetoresistive elements 12c and 12d have resistances changing in accordance with the intensity of the magnetic field parallel with upper surface 5a of substrate 5. Magnetoresistive elements 12c and 12d output voltage signals having values in accordance with the resistances.

Similarly to magnetoresistive elements 12a and 12b, each of magnetoresistive elements 12a and 12b includes a pattern having plural strip shapes of thin films made of NiFe.

Magnetoresistive elements 12c is disposed at an angle of 90 degrees with respect to magnetoresistive elements 12a. This configuration provides a phase difference of 90 degrees between changes in the output voltages of magnetoresistive elements 12c and 12a caused in response to the rotation of object 1.

Magnetoresistive element 12c detects a magnetic field along detection axis 12cp which is parallel with upper surface 5a of substrate 5 and inclines at an angle of 90 degrees with respect to rotating detection axis 12ap. In detail, magnetoresistive element 12c exhibits a higher sensitivity to the magnetic field along detection axis 12cp than to a magnetic field along any axis which is not in parallel with detection axis 12cp.

Magnetoresistive element 12d is disposed at an angle of 90 degrees with respect to magnetoresistive elements 12c. This configuration provides a phase difference of 90 degrees between changes in the output voltages of magnetoresistive elements 12d and 12c caused in response to the rotation of object 1.

Magnetoresistive element 12d detects a magnetic field along detection axis 12dp which is parallel with upper surface 5a of substrate 5 and inclines at an angle of 90 degrees with respect to rotating detection axis 12cp. In detail, magnetoresistive element 12d exhibits a higher sensitivity to the magnetic field along detection axis 12dp than to a magnetic field along any axis which is not in parallel with detection axis 12dp.

Magnetoresistive elements 12a, 12b, 12c, and 12d are preferably disposed at positions closest possible to each other on upper surface 5a of substrate 5.

Figure 6:
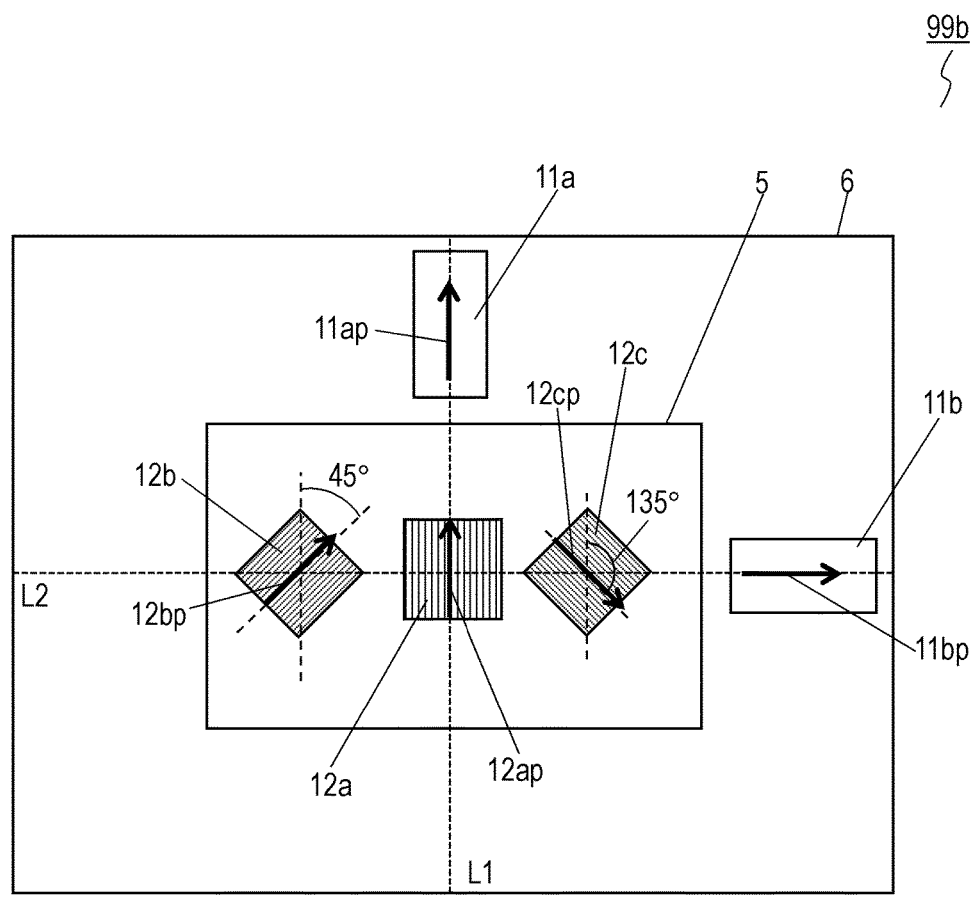
FIG. 6 is a top view of still another magnetic sensor according to Embodiment 1.

FIG. 6 is a top view of still another magnetic sensor 99b according to Embodiment 1. In FIG. 6, components identical to those of magnetic sensor 99 shown in FIG. 2 are denoted by the same numerals.

In magnetic sensor 99b, substrate 5 includes magnetoresistive elements 12a and 12b, and further includes magnetoresistive element 12c.

Magnetoresistive element 12c is disposed at an angle of 135 degrees with respect to magnetoresistive elements 12a. This configuration provides a phase difference of 135 degrees between changes in the output voltages of magnetoresistive element 12c and 12a caused in response to the rotation of object 1. Magnetoresistive element 12c detects a magnetic field along detection axis 12cp which is parallel with upper surface 5a of substrate 5 and inclines at an angle of 135 degrees with respect to detection axis 12ap. In detail, magnetoresistive element 12c exhibits a higher sensitivity to the magnetic field along detection axis 12cp than to a magnetic field along any axis which is not in parallel with detection axis 12cp.

Figure 7:
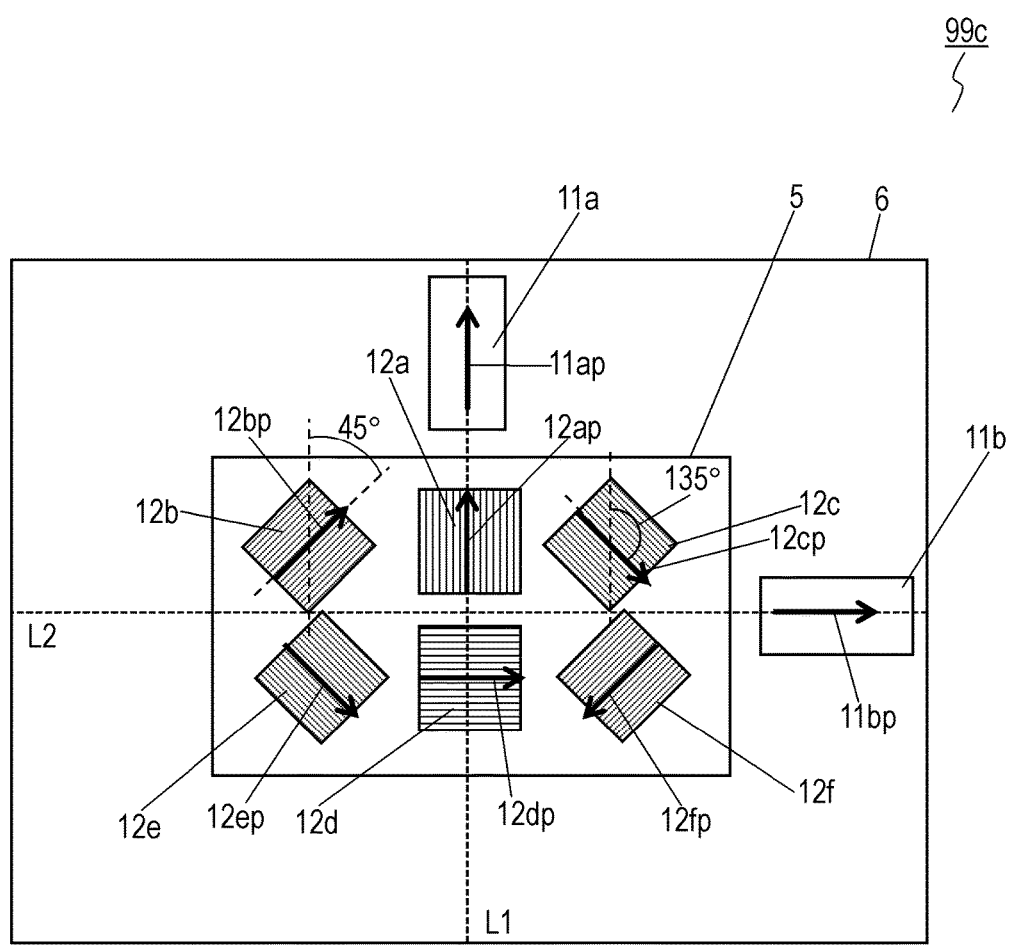
FIG. 7 is a top view of a further magnetic sensor according to Embodiment 1.

FIG. 7 is a top view of further magnetic sensor 99c according to Embodiment 1. In FIG. 7, components identical to those of magnetic sensor 99b shown in FIG. 6 are denoted by the same numerals. In magnetic sensor 99c, substrate 5 includes magnetoresistive elements 12a to 12c, and further includes magnetoresistive elements 12d, 12e, and 12f. Additional magnetoresistive elements 12d, 12e, and 12f are preferably disposed to obtain twice larger magnitude of the output from the magnetoresistive elements with the additional magnetoresistive elements than that without the additional ones.

Magnetoresistive element 12d is disposed at an angle of 90 degrees with respect to magnetoresistive elements 12a. This configuration provides a phase difference of 90 degrees between changes in the output voltages of magnetoresistive elements 12d and 12a caused in response to the rotation of object 1. Magnetoresistive element 12d detects a magnetic field along detection axis 12dp which is parallel with upper surface 5a of substrate 5 and inclines at an angle of 90 degrees with respect to detection axis 12ap. In detail, magnetoresistive element 12d exhibits a higher sensitivity to the magnetic field along detection axis 12dp than to a magnetic field along any axis which is not in parallel with detection axis 12dp.

Magnetoresistive element 12e is disposed at an angle of 90 degrees with respect to magnetoresistive elements 12b. This configuration provides a phase difference of 90 degrees between changes in the output voltages of magnetoresistive elements 12e and 12b caused in response to the rotation of object 1. Magnetoresistive element 12e detects a magnetic field along detection axis 12ep which is parallel with upper surface 5a of substrate 5 and inclines at an angle of 90 degrees with respect to detection axis 12bp. In detail, magnetoresistive element 12e exhibits a higher sensitivity to the magnetic field along detection axis 12ep than to a magnetic field along any axis which is not in parallel with detection axis 12ep.

Magnetoresistive elements 12f is disposed at an angle of 90 degrees with respect to magnetoresistive elements 12c. This configuration provides a phase difference of 90 degrees between changes in the output voltages of magnetoresistive elements 12f and 12c caused in response to the rotation of object 1. Magnetoresistive element 12f detects a magnetic field along detection axis 12fp which is parallel with upper surface 5a of substrate 5 and inclines at an angle of 90 degrees with respect to detection axis 12cp. In detail, magnetoresistive element 12f exhibits a higher sensitivity to the magnetic field along detection axis 12fp than to a magnetic field along any axis which is not in parallel with detection axis 12fp.

Figure 8:
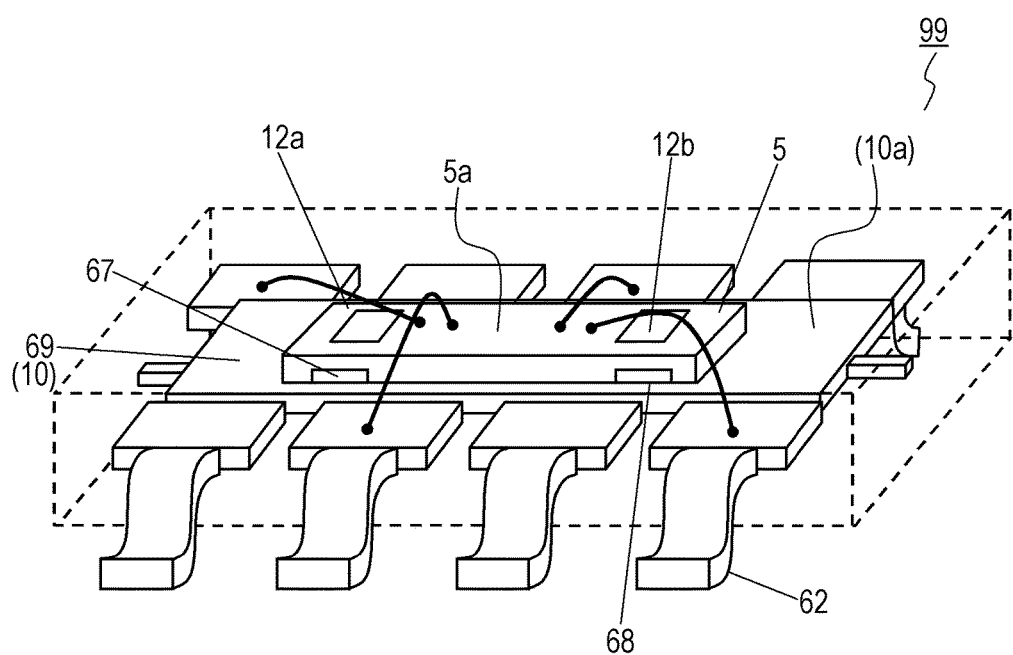
FIG. 8 is a perspective view of the magnetic sensor according to Embodiment 1 for illustrating electrical connection thereof.
Figure 9:
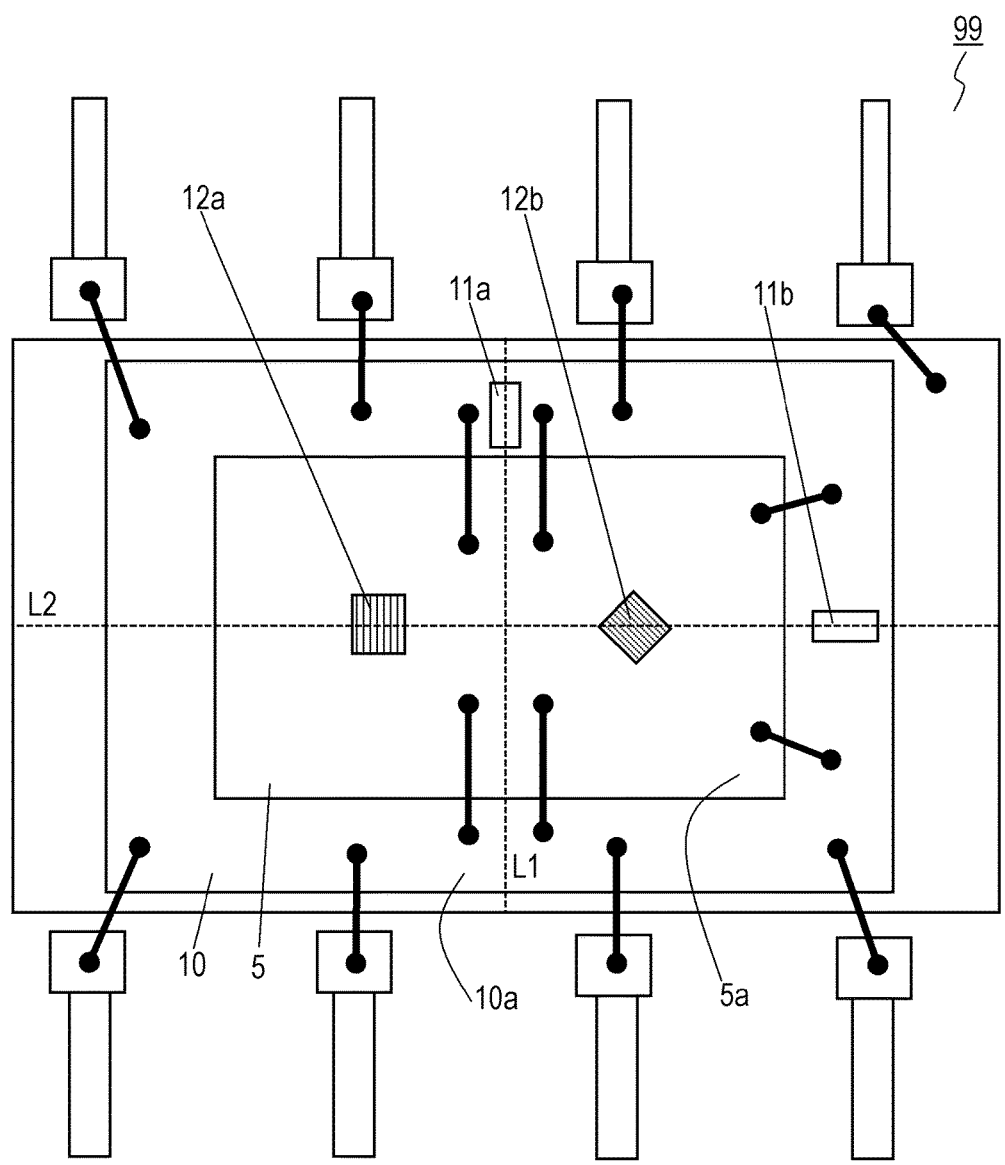
FIG. 9 is a top view of the magnetic sensor according to Embodiment 1 for illustrating electrical connection thereof.

FIG. 8 is a perspective view of magnetic sensor 99 according to Embodiment 1 for illustrating electrical connection. FIG. 9 is a top view of magnetic sensor 99 for illustrating electrical connection. As shown in FIG. 8, substrate 5 includes magnetic medium 67 and magnetic medium 68.

Magnetic medium 67 is disposed directly below magnetoresistive element 12a. Magnetic medium 68 is disposed directly below magnetoresistive element 12b. The arrangement of magnetic media 67 and 68 located directly blow magnetoresistive elements 12a and 12b allows magnetoresistive elements 12a and 12b to be easily influenced by magnetization biases applied by magnetic media 67 and 68, respectively.

Substrate 10 is preferably mounted on die pad 69 and sealed with resin. Substrate 10 is preferably coupled with terminals 62 with metal wires.

Magnetic medium 67 and magnetic medium 68 are disposed away from each other with a distance between medium 67 and magnetic medium 68 which is not smaller than 0.05 mm and not larger than 3.0 mm. The magnetization direction of magnetic medium 67 is parallel (including "substantially parallel") with the longitudinal direction of substrate 10.

The magnetization direction of magnetic medium 68 is perpendicular (including "substantially perpendicular") to the magnetization direction of magnetic medium 67.

In magnetic sensor 99 shown in FIGS. 1A and 1B, substrate 10 is closer to object 1 than substrate 5; however, the configuration is not limited to this.

Substrate 5 may be closer to object 1 than substrate 10. In other words, the distance between substrate 5 and object 1 is smaller than a distance between substrate 10 and object 1. This configuration preferably reduces the distance between object 1 and each of magnetoresistive elements 12a and 12b, enhancing detection sensitivity.

Each of magnetic media 67 and 68 preferably contains a resin and a rare-earth magnetic powder dispersed in the resin. Each of magnetic media 67 and 68 preferably further contains sulfur and nitrogen, and is preferably a hard-magnetic material. More specifically, magnetic medium 67 and magnetic medium 68 are preferably made of material containing SmFeN.

In this case, each of the media preferably contains a resin and a magnetic powder of SmFeN dispersed in the resin. Each of magnetic media 67 and 68 may be preferably made of material containing, e,g, a magnetic powder of SmFeN and a molding resin. The material of SmFeN are easily resin-molded and easily embedded in grooves in provided substrate 5 sue to its stable molded shape The situation expressed by the terms "shifted by 90 degrees" used in the above descriptions includes the situation expressed by "shifted by substantially 90 degrees" which permits design tolerance. This holds also for other angles.

The situation expressed by the terms "incline at an angle of 90 degrees" used in the above descriptions includes the situation expressed by "incline at an angle of substantially 90 degrees" which permits design tolerance. This holds also for other angles.

Exemplary Embodiment 2

Figure 10:
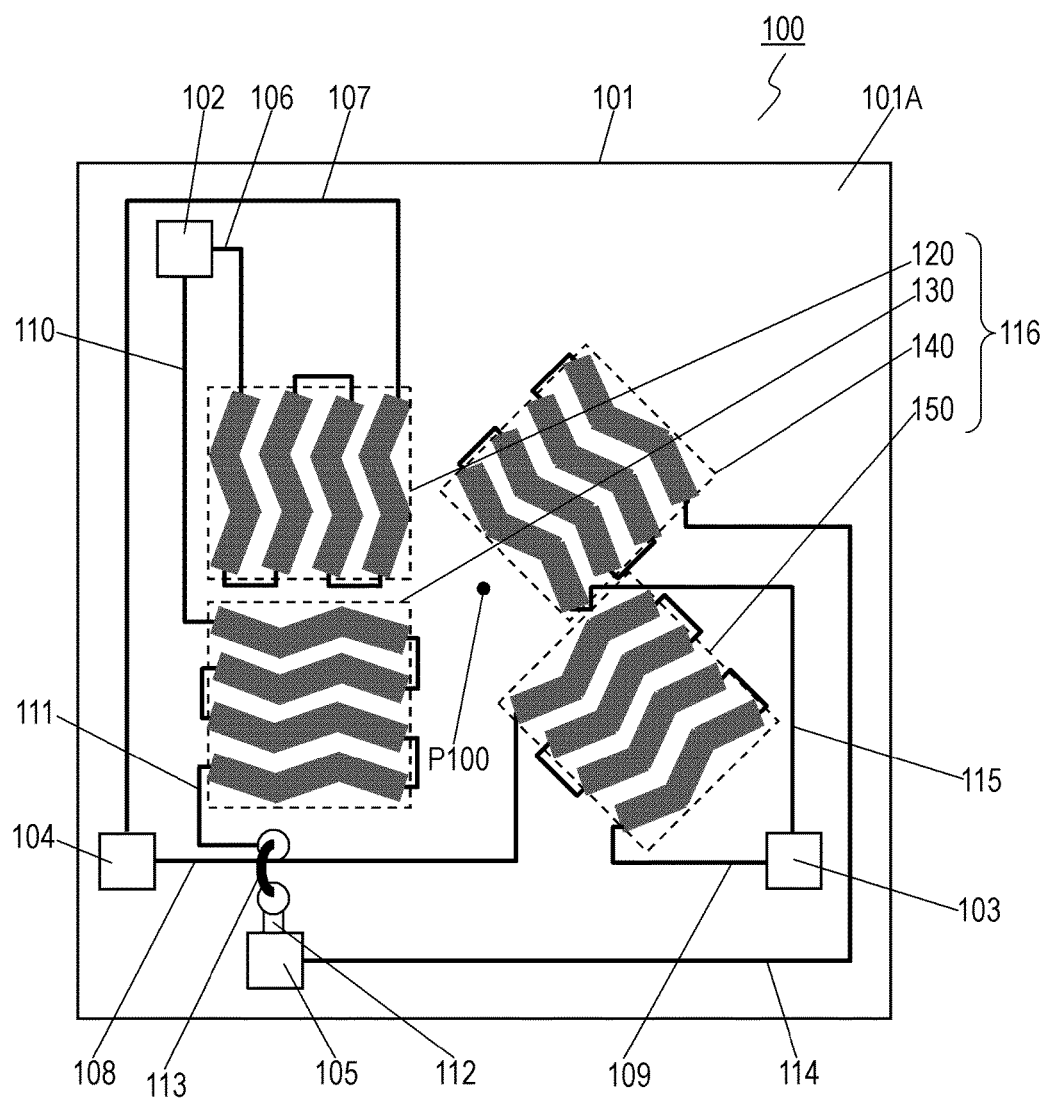
FIG. 10 is a top view of a magnetic sensor according to Exemplary Embodiment 2.

FIG. 10 is a top view of magnetic sensor 100 according to Exemplary Embodiment 2.

Magnetic sensor 100 includes substrate 101 and magnetoresistive element group 116 disposed on upper surface 101A of substrate 101.

Magnetoresistive element group 116 includes magnetoresistive elements 120, 130, 140, and 150.

Input electrode 102, ground electrode 103, output electrodes 104 and 105, and wires 106, 107, 108, 109, 110, 111, 112, 114, and 115 are provided on upper surface 101A of substrate 101.

Jumper wire 113 strides over wire 108 and is electrically coupled with wires 111 and 112. Jumper wire 113 is electrically insulated from wire 108.

Substrate 101 is made of silicon and has a plate shape.

Magnetoresistive elements 120, 130, 140, and 150 exhibit a magnetoresistive effect in which their resistances change upon having a magnetic field applied. Each of magnetoresistive elements 120, 130, 140, and 150 is, for example, a large magnetoresistive element. Specifically, each of the magnetoresistive elements is made of an artificial lattice film which includes: a magnetic layer containing Ni, Co, and Fe; and a non-magnetic layer containing Cu which is laminated on the magnetic layer.

Input electrode 102 is electrically connected to magnetoresistive element 120 via wire 106, and is electrically connected to magnetoresistive element 130 via wire 110.

Ground electrode 103 is electrically connected to magnetoresistive element 140 via wire 115, and is electrically connected to magnetoresistive element 150 via wire 109.

Output electrode 104 is electrically connected to magnetoresistive element 120 via wire 107, and is electrically connected to magnetoresistive element 150 via wire 108.

Output electrode 105 is electrically connected to magnetoresistive element 130 via wire 111, wire 112, and jumper wire 113, and is electrically connected to magnetoresistive element 140 via wire 114.

Magnetoresistive elements 120 and 140 constitute a half-bridge circuit. Magnetoresistive elements 130 and 150 constitute a half-bridge circuit.

As shown in FIG. 10, an X-axis and a Y-axis perpendicular to each other are defined as follows: The direction of the X-axis is the left and right direction on the paper sheet of the Figure while the direction of the Y-axis is the up and down directions on the paper sheet of the Figure.

Figure 11:
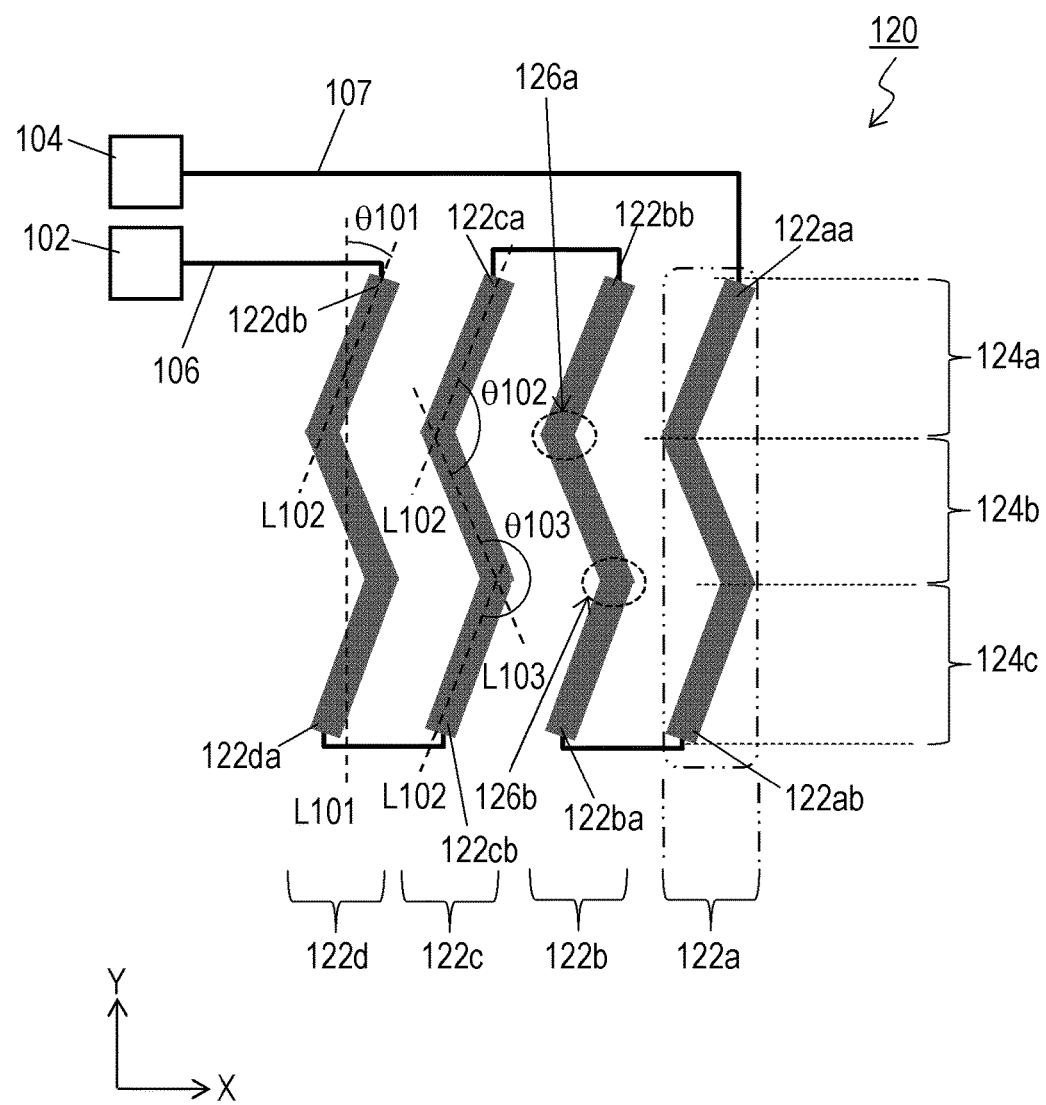
FIG. 11 is a top view of a magnetoresistive element of the magnetic sensor according to Embodiment 2.

FIG. 11 is an enlarged view of magnetoresistive element 120 shown in FIG. 10. The X-axis and Y-axis shown in FIG. 10 are identical to the X-axis and Y-axis shown in FIG. 11, respectively.

Magnetoresistive element 120 includes patterns 122a, 122b, 122c, and 122d.

Each of patterns 122a, 122b, 122c, and 122d includes parts 124a, 124b, and 124c.

Parts 124a, 124b, and 124c extend straight.

Each of patterns 122a, 122b, 122c, and 122d includes bent parts 126a and 126b.

Bent part 126a couples part 124a to part 124b. Part 124a is coupled with part 124b at bent part 126a.

Bent part 126b couples part 124b to part 124c. Part 124b is coupled with part 124c at bent part 126b.

One end 122aa of pattern 122a is coupled with output electrode 104 via wire 107.

The other end 122ab of pattern 122a is coupled with one end 122ba of pattern 122b via a wire.

The other end 122bb of pattern 122b is coupled with one end 122ca of pattern 122c via a wire.

The other end 122cb of pattern 122c is coupled with one end 122da of pattern 122d via a wire.

The other end 122db of pattern 122d is coupled with input electrode 102 via wire 106.

The wire that couples the other end 122ab of pattern 122a to one end 122ba of pattern 122b may be a part of the magnetoresistance or, alternatively, may be another wire made of, e.g. metal that is disposed separately.

The wire that couples the other end 122bb of pattern 122b to one end 122ca of pattern 122c may be a part of the magnetoresistance or, alternatively, may be another wire made of, e.g. metal that is disposed separately.

The wire that couples the other end 122cb of pattern 122c to one end 122da of pattern 122d may be a part of the magnetoresistance or, alternatively, may be another wire made of, e.g. metal that is disposed separately.

Patterns 122a, 122b, 122c, and 122d extend and meander in parallel with each other.

That is, part 124a of pattern 122a, part 124a of pattern 122b, part 124a of pattern 122c, and part 124a of pattern 122d extend straight in parallel with each other. Part 124b of pattern 122a, part 124b of pattern 122b, part 124b of pattern 122c, and part 124b of pattern 122d extend straight in parallel with each other. Part 124c of pattern 122a, part 124c of pattern 122b, part 124c of pattern 122c, and part 124c of pattern 122d extend straight in parallel with each other.

Each of virtual lines L101, L102, and L103 is a virtually-defined straight line passes through respective one of the magnetoresistive elements. Each of virtual lines L101, L102, and L103 does not indicate any real line actually disposed on respective one of the magnetoresistive elements, and is a line virtually defined only for illustrating the structure of the magnetoresistive elements.

Virtual line L101 passes along the center line of a maximum width of patterns 122a to 122d which meander.

Virtual line L102 passes substantially through the widthwise center of part 124a.

Virtual line L103 passes substantially through the widthwise center of part 124b.

Virtual line L104 passes substantially through the widthwise center of part 124c.

Angle θ101 between virtual lines L101 and L102 is 22.5 degrees in accordance with Embodiment 2. Angle θ102 between virtual lines L102 and L103 is 135 degrees in accordance with Embodiment 2. Angle θ103 between virtual lines L103 and L104 is 225 degrees in accordance with Embodiment 2.

That is, in accordance with Embodiment 2, angle θ102 between parts 124a and 124b is 135 degrees, and angle θ103 between parts 124b and 124c is 225 degrees.

This configuration cancels waves at the vicinity of an angle of about 22.5 degrees on which third harmonic waves are superimposed, thereby reducing waveform distortions.

Magnetoresistive elements 120, 130, 140, and 150 are symmetrical to one another with respect to point P100. Point P100 serving as a center of the point symmetry is located at a position to which distances from magnetoresistive element 120, 130, 140, and 150 are identical to one another.

The angular interval between magnetoresistive elements 120 and 130 about point P100 is 90 degrees.

The angular interval between magnetoresistive elements 140 and 150 about point P100 is 90 degrees.

The angular interval between magnetoresistive elements 120 and 140 about point P100 is 45 degrees.

Figure 12:
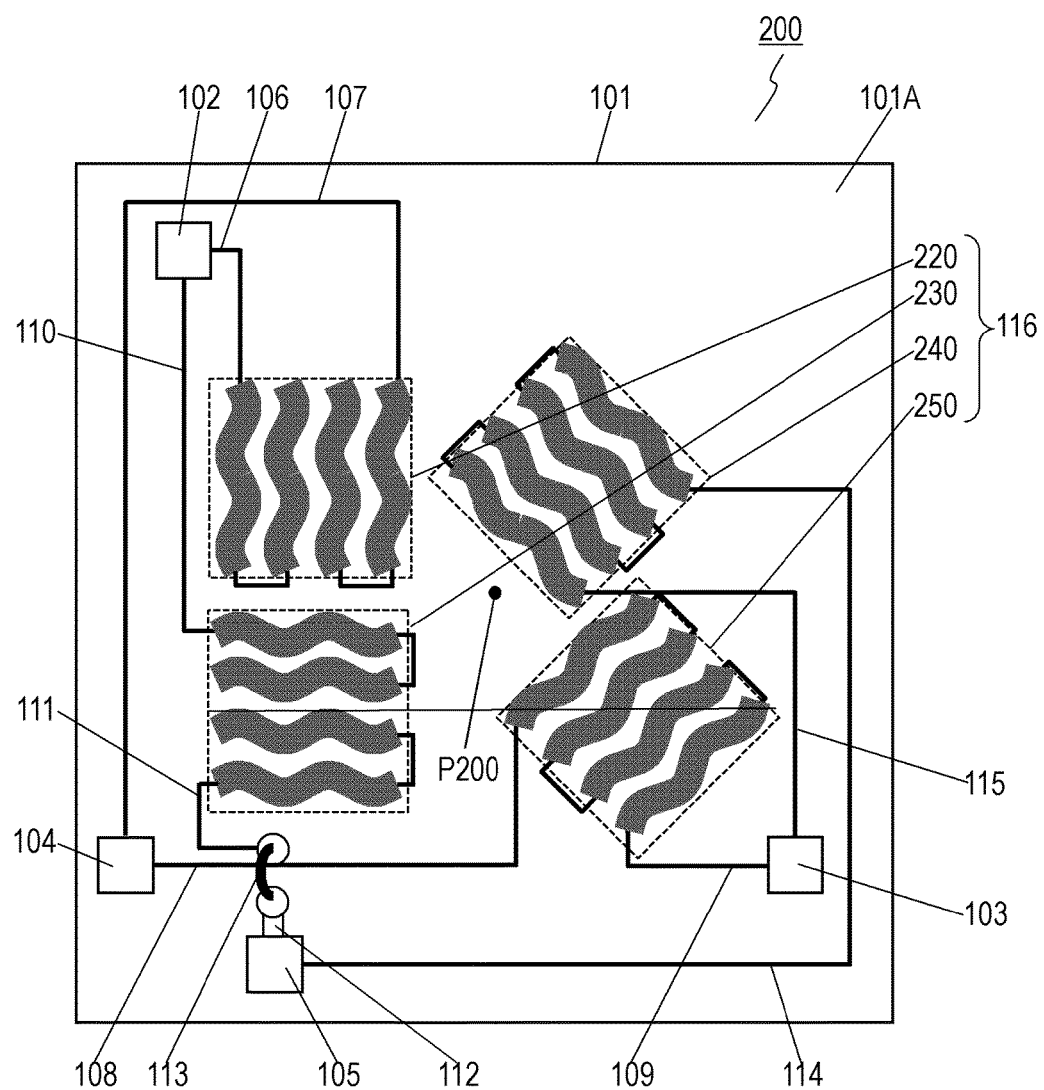
FIG. 12 is a top view of another magnetic sensor according to Embodiment 2.
Figure 13:
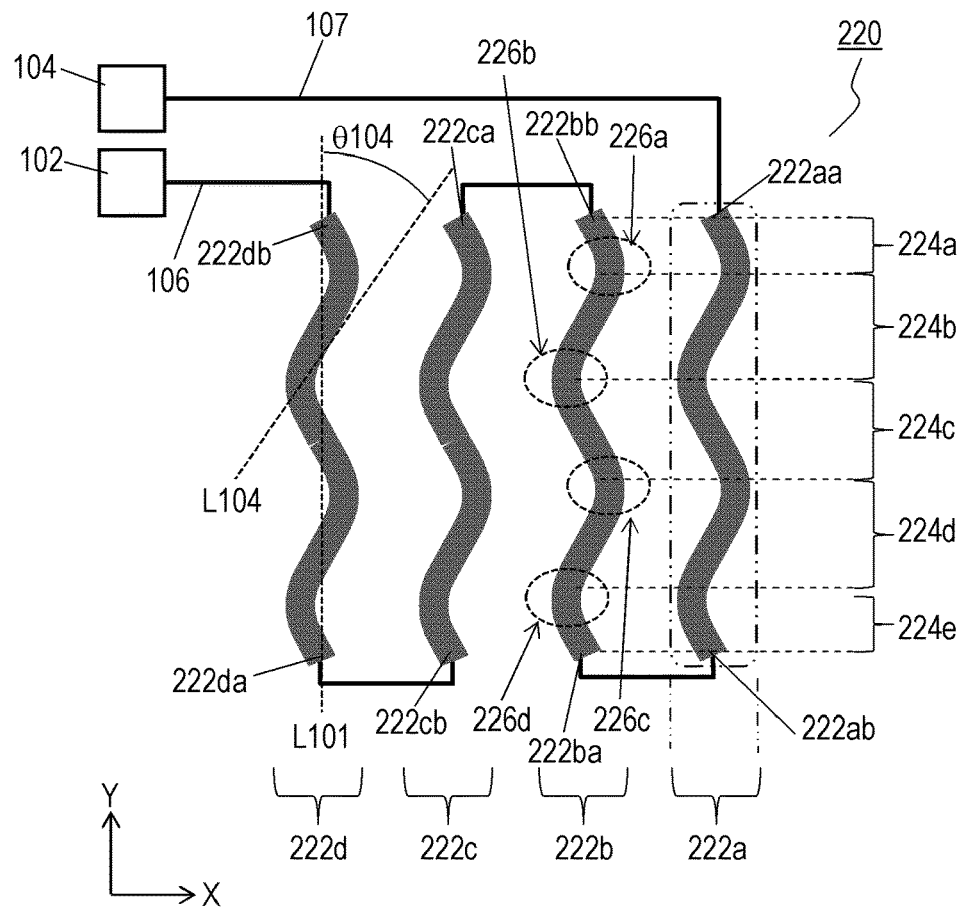
FIG. 13 is a top view of a magnetoresistive element of the magnetic sensor shown in FIG. 12.

FIG. 12 is a top view of another magnetic sensor 200 according to Embodiment 2. FIG. 13 is a top view of magnetoresistive element 220 of magnetic sensor 200.

Magnetoresistive element 220 includes patterns 222a, 222b, 222c, and 222d.

Each of patterns 222a, 222b, 222c, and 222d includes parts 224a, 224b, 224c, 224d, 224e and bent part 226a, 226b, 226c, and 226d.

Bent part 226a couples part 224a to part 224b. Part 224a is coupled with part 224b at bent part 226a.

Bent part 226b couples part 224b to part 224c. Part 224b is coupled with part 224c at bent part 226b.

Bent part 226c couples part 224c to part 224d. Part 224c is coupled with part 224d at bent part 226c.

Bent part 226d couples part 224d to part 224e. Part 224d is coupled with part 224e at bent part 226d.

One end 222aa of pattern 222a is coupled with output electrode 104 via wire 107.

The other end 222ab of pattern 222a is coupled with one end 222ba of pattern 222b via a wire.

The other end 222bb of pattern 222b is coupled with one end 222ca of pattern 222c via a wire.

The other end 222cb of pattern 222c is coupled with one end 222da of pattern 222d via a wire.

The other end 222db of pattern 222d is coupled with input electrode 102 via wire 106.

The wire that couples the other end 222ab of pattern 222a to one end 222ba of pattern 222b may be a part of the magnetoresistance or, alternatively, may be another wire made of, e.g. metal disposed separately.

The wire that couples the other end 222bb of pattern 222b to one end 222ca of pattern 222c may be a part of the magnetoresistance or, alternatively, may be another wire made of, e.g. metal disposed separately.

The wire that couples the other end 222cb of pattern 222c to one end 222da of pattern 222d may be a part of the magnetoresistance or, alternatively, may be another wire made of, e.g. metal disposed separately.

Patterns 222a, 222b, 222c, and 222d extend and meander in parallel with each other.

Each of virtual lines L104 is a virtually-defined straight line passing through respective one of the magnetoresistive elements. Each of the virtual lines does not indicate a real line actually disposed on respective one of the magnetoresistive elements, and is a line that is virtually defined only for illustrating the structure of respective one of the magnetoresistive elements. Virtual line L101 is identical to virtual line L101 shown in FIG. 11.

Virtual lines L104 is tangent to a position on pattern 222a at which pattern 222a forms the largest angle with respect to virtual line L101.

Angle θ104 between virtual lines L101 and L104 is 22.5 degrees in accordance with Embodiment 2.

A portion of each of patterns 222a to 222d between bent parts 226a and 226b extends while curving.

A portion of each of patterns 222a to 222d between bent parts 226b and 226c extends while curving.

A portion of each of patterns 222a to 222d between bent parts 226c and 226d extends while curving.

Each of patterns 222a, 222b, 222c, and 222d meanders in accordance with a function of sin θ where θ is 360×N (N is an arbitrary number not smaller than one). In other words, pattern 222a has a sine-wave shape.

Magnetoresistive elements 220, 230, 240, and 250 are symmetrical to one another with respect to point P200. Point P200 serving as the center of the point symmetry is located at a position to which distances from magnetoresistive elements 220, 230, 240, and 250 are identical to one another.

The angular interval between magnetoresistive elements 220 and 230 about point P200 is 90 degrees.

The angular interval between magnetoresistive elements 240 and 250 about point P200 is 90 degrees.

The angular interval between magnetoresistive elements 220 and 240 about point P200 is 45 degrees.

Figure 14:
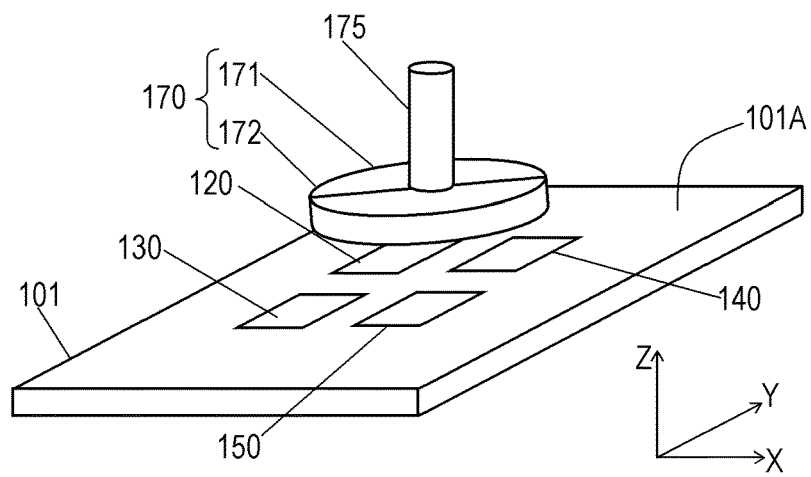
FIG. 14 is a perspective view of the magnetic sensor according to Embodiment 2 for illustrating its usage.
Figure 15:
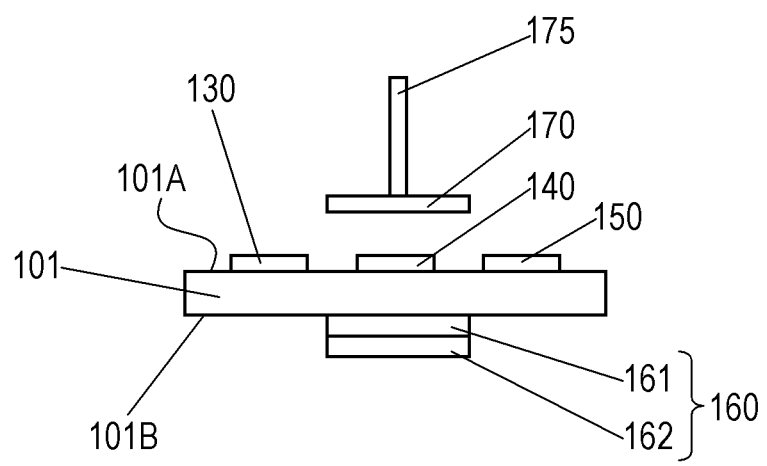
FIG. 15 is a side view of the magnetic sensor according to Embodiment 2 for illustrating its usage.
Figure 16:
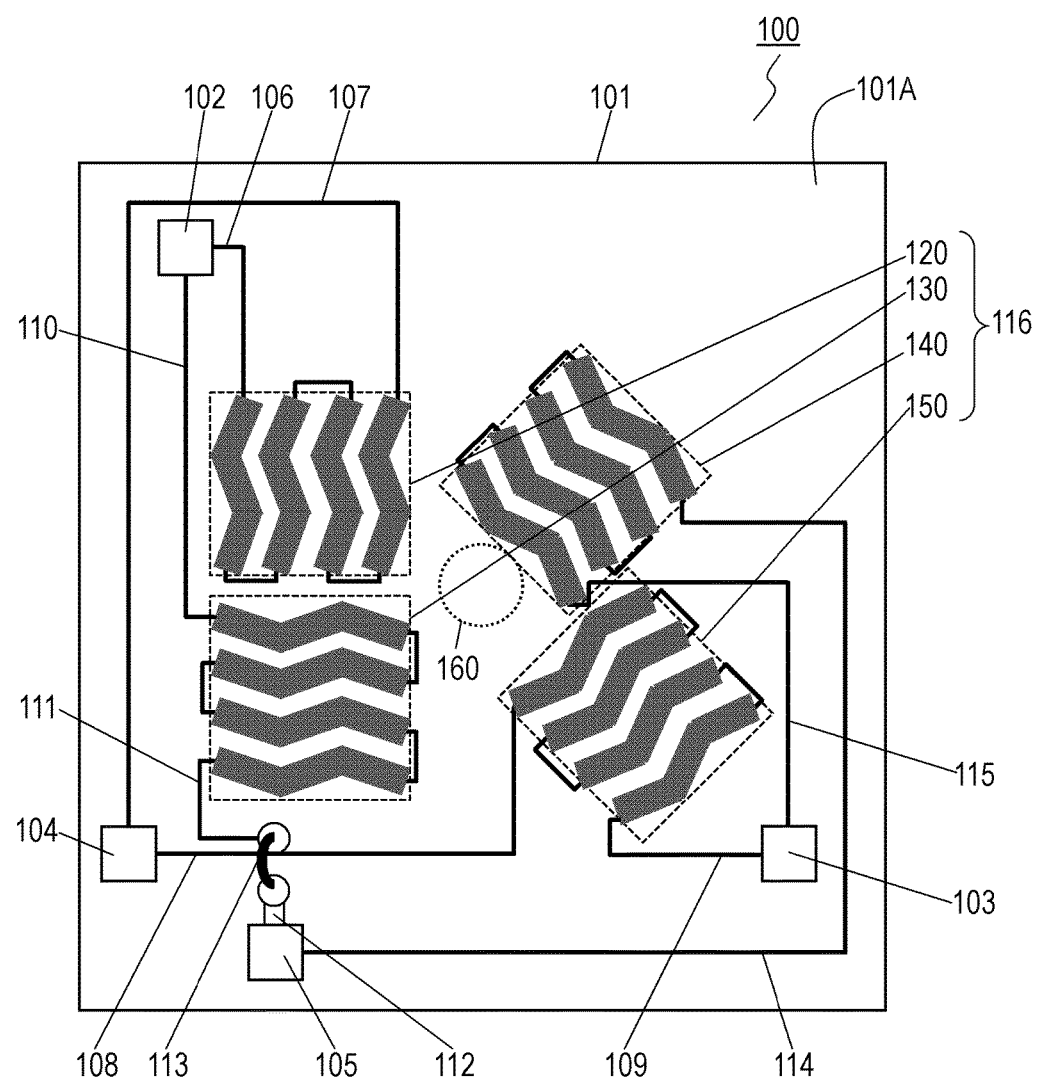
FIG. 16 is a top view of the magnetic sensor according to Embodiment 2 for illustrating its usage.

FIG. 14 is a perspective view of magnetic sensor 100 shown in FIG. 10 according to Embodiment 2 for illustrating its usage. FIG. 15 is a side view of magnetic sensor 100 for illustrating its usage. FIG. 16 is a top view of magnetic sensor 100 for illustrating its usage. FIGS. 14 and 15 are simplified in detailed pattern shapes of magnetoresistive elements 120, 130, 140, and 150; only their outlines are shown there. In addition, wires 106 to 112, jumper line 113, wires 114 and 115 are omitted in the drawings.

Substrate 101 has lower surface 101B opposite to upper surface 101A. Bias magnet 160 is provided on lower surface 101B of substrate 101. Bias magnet 160 includes N-pole permanent magnet 161 and S-pole permanent magnet 162. The direction connecting N-pole permanent magnet 161 to S-pole permanent magnet 162 is perpendicular to lower surface 101B of substrate 101. In FIG. 15, lower surface 101B contacts N-pole permanent magnet 161; however, lower surface 101B may contact S-pole permanent magnet 162 instead. As shown in FIG. 16, viewing from above, bias magnet 160 does not overlap any of magnetoresistive elements 120, 130, 140, and 150. In other words, bias magnet 160 does not overlap magnetoresistive element group 116 in a plan view (viewing from above).

Rotary magnet 170 is rotatably supported by rotary shaft 175. Rotary magnet 170 includes an N-pole and an S-pole. A line connecting the N-pole to the S-pole is parallel with upper surface 101A substrate 101.

Magnetoresistive elements 120, 130, 140, and 150 receive a magnetic field obtained by to a combination of the magnetic field from bias magnet 160 and the magnetic field from rotary magnet 170. The absolute value of intensity of the magnetic field at a certain point on substrate 101 of magnetic sensor 100 changes along a cycle in which rotary magnet 170 rotates one time. Each of magnetoresistive elements 120, 130, 140, and 150 has magnetic isotrophy and has a resistance changing in accordance with the absolute value of the intensity of the magnetic field. Therefore, the resistance of each of magnetoresistive elements 120, 130, 140, and 150 changes along the cycle in which rotary magnet 170 rotates by one rotation.

A voltage applied across input electrode 102 and ground electrode 103 causes output electrode 104 to output a voltage in accordance with changes in the resistances of magnetoresistive elements 120 and 140. Similarly, output electrode 105 as well outputs a voltage in accordance with changes in the resistances of magnetoresistive elements 130 and 150.

One output voltage along a sine wave corresponds to two angles except 90 degrees and 270 degrees. Accordingly, the rotation angle of rotary magnet 170 can be determined based on the outputs from output electrodes 104 and 105 having a phase difference of 90 degrees from each other. That is, magnetic sensor 100 can determine the rotation angle of rotary magnet 170. The rotation angle of a rotatable object can be determined by measuring the rotation angle of rotary magnet 170 while the object is coupled with rotary magnet 170.

The usages shown in FIGS. 14 to 16 are just examples, and usages other than these usages may be adopted.

In accordance with Embodiment 2, magnetoresistive element group 116 includes magnetoresistive elements 120, 130, 140, and 150. The magnetoresistive element group may include only magnetoresistive elements 120 and 130. In this case, for example, resistors may be connected instead of magnetoresistive elements 140 and 150. Even in this case, an output in accordance with the rotation angle of rotary magnet 170 can be obtained from output electrodes 104 and 105.

Magnetic sensor 100 includes substrate 101 and magnetoresistive element group 116, and may further include bias magnet 160. Magnetic sensor 100 includes substrate 101 and magnetoresistive element group 116, and may further include rotary magnet 170. Magnetic sensor 100 includes substrate 101 and magnetoresistive element group 116, and may further include bias magnet 160 and rotary magnet 170.

In the accordance with Embodiment 2, the X-axis is perpendicular to the Y-axis; however, the X-axis may incline with respect to the Y-axis at any predetermined angle except for angles at which the X-axis is parallel with the Y-axis.

Substrate 101 may be made of an alumina substrate instead of the silicon substrate.

In accordance with Embodiment 2, magnetoresistive elements 120, 130, 140, and 150 have the resistances identical to each other and the same magnetoresistive (MR) characteristics identical to each other. Therefore, it is possible to easily determine the rotation angle from the output voltages of output electrodes 104 and 105. However, at least one of the case that the resistances are identical to each other and the case that the magnetoresistive (MR) characteristics are identical to each other may not be satisfied.

In accordance with Embodiment 2, magnetoresistive elements 120, 130, 140, and 150 have shapes identical to each other, and therefore, have MR characteristics identical to each other. Magnetoresistive elements 120, 130, 140, and 150 are symmetrical to one another with respect to a point, and therefore, the changes in the resistances in accordance with the rotation angle of rotary magnet 170 can be identical to one another. This configuration allows the rotation angle to be easily determined based on the outputs of output electrodes 104 and 105. The same advantageous effects can be obtained even in the case where magnetoresistive elements 120, 130, 140, and 150 are arranged symmetrically to one another with respect to a point, and reversed. However, the shapes of magnetoresistive elements 120, 130, 140, and 150 are not necessarily identical to one another. Magnetoresistive elements 120, 130, 140, and 150 are not necessarily symmetrical to one another with respect to a point.

In Embodiment 2, bias magnet 160 is disposed on lower surface 101B of substrate 101; however, the bias magnet may be disposed on upper surface 101A side of the substrate. In this case, bias magnet 160 may be disposed between upper surface 101A and magnetoresistive element group 116 or, alternatively, disposed on an upper surface of magnetoresistive element group 116.

In accordance with Embodiment 2, bias magnet 160 is disposed such that a line connecting N-pole permanent magnet 161 to S-pole permanent magnet 162 is perpendicular to lower surface 101B; however, the line connecting N-pole permanent magnet 161 to S-pole permanent magnet 162 may be parallel with lower surface 101B. In the case where the line connecting N-pole permanent magnet 161 to S-pole permanent magnet 162 is parallel with lower surface 101B, changes in the magnetic field are larger than those in the case where the line connecting N-pole permanent magnet 161 to S-pole permanent magnet 162 is perpendicular to lower surface 101B. Therefore, N-pole permanent magnet 161 and S-pole permanent magnet 162 are disposed to prevent the resistances from being saturated due to the changes in the magnetic field.

Exemplary Embodiment 3

Figure 17:
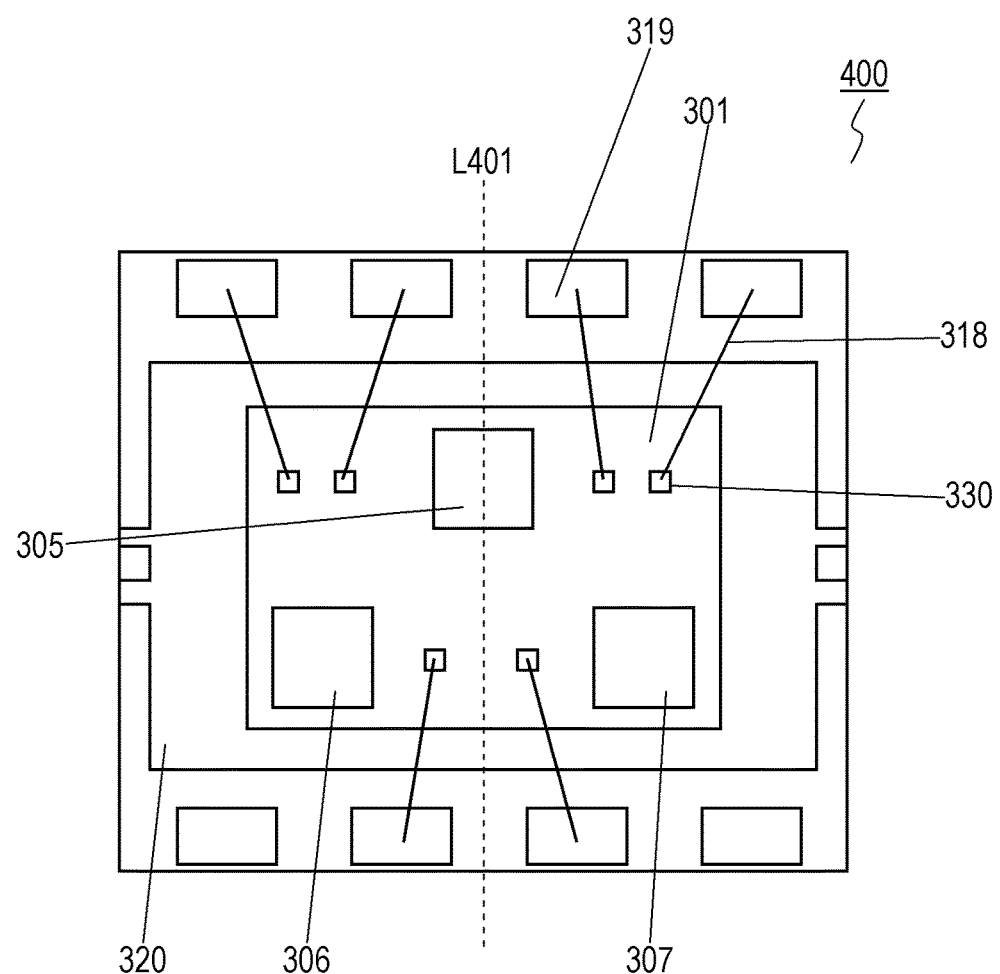
FIG. 17 is a schematic view of a magnetic sensor according to Exemplary Embodiment 3.

FIG. 17 is a schematic top view of magnetic sensor 400 according to Exemplary Embodiment 3. Magnetic sensor 400 includes die pad 320 and substrate 301 disposed on die pad 320. Substrate 301 includes magnetoresistive elements. Pads 330 are disposed on substrate 301, and includes pads via which outputs from the magnetoresistive elements are drawn, a pad via which a voltage is applied to the magnetoresistive elements, and a pad via which the magnetoresistive elements are coupled with the ground. A magnet group including magnets 305 and 306 is disposed on substrate 301. The magnet group preferably further includes magnet 307. Then, external terminals 319 and pads 330 of magnetic sensor 400 are electrically coupled with each other via wires 318.

As shown in FIG. 17, substrate 301 is mounted to die pad 320 while the lower surface of substrate 301 preferably faces die pad 320. Die pad 320 is made of a metal. Die pad 320 is disposed on a ground pattern, thereby eliminating external noises that entering to an entire of magnetic sensor 400.

In the magnetic sensor disclosed in PYL 2, magnetic-resistance characteristic waveforms of the magnetoresistive elements are distorted away from ideal curves, so that noises caused by superimposed higher harmonics cannot be sufficiently cancelled. For this reason, the magnetic sensor may not detect magnetism accurately.

Figure 18:
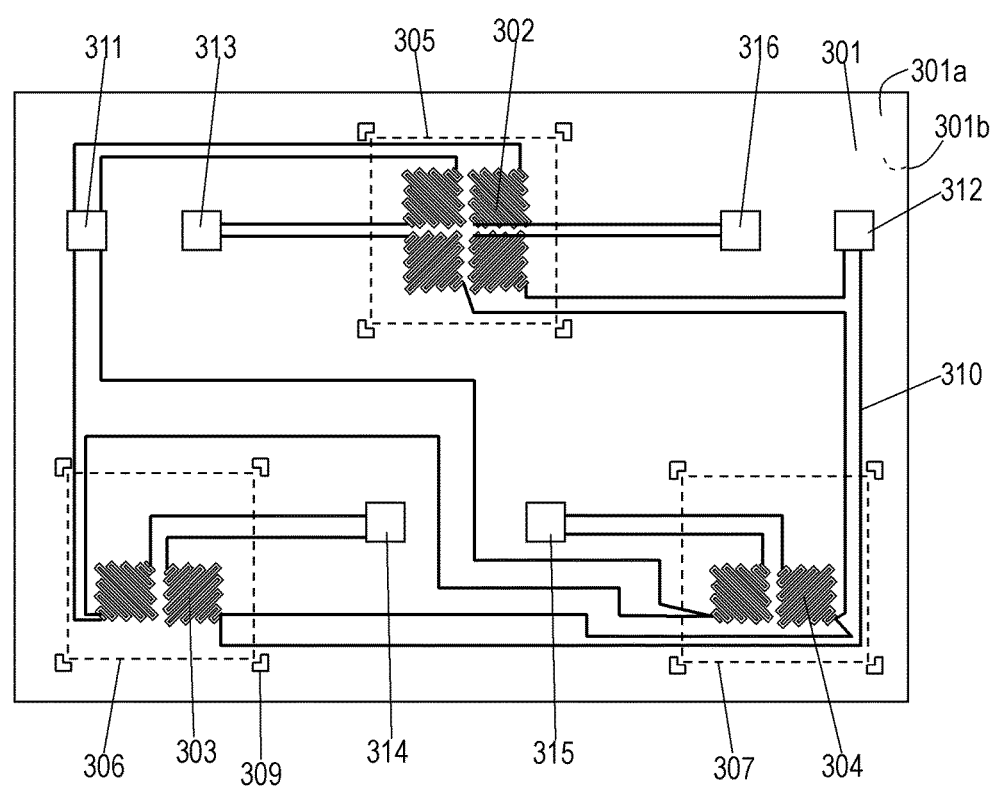
FIG. 18 is a schematic top view of a substrate of the magnetic sensor according to Embodiment 3.

FIG. 18 is a schematic top view of substrate 301. FIG. 18 focuses on magnetoresistive element patterns, wiring patterns, pads, etc., which are disposed on substrate 301, and shows regions in which the magnet group is disposed by dashed lines.

As shown in FIG. 18, magnetic sensor 400 includes substrate 301, the magnetoresistive element group disposed on substrate 301, and the magnet group. Substrate 301 has upper surface 301a and lower surface 301b. The magnetoresistive element group includes magnetoresistive elements 302 and 303. The magnet group includes magnet 305 corresponding to magnetoresistive element 302 and magnet 306 corresponding to magnetoresistive element 303. In magnetic sensor 400 according to the present embodiment, magnets 305 and 306 can separately apply magnetic biases to magnetoresistive elements 302 and 303, respectively, that constituting the magnetoresistive element group. This configuration increases freedom in the design as follows. That is, the magnets can apply not only magnetic biases in the same direction to magnetoresistive elements 302 and 303, but also magnetic biases in directions different from each other to magnetoresistive elements 302 and 303. This configuration provides magnetic sensor 400 with a small size and high accuracy.

An operation of magnetic sensor 400 will be described below.

Figure 19A:
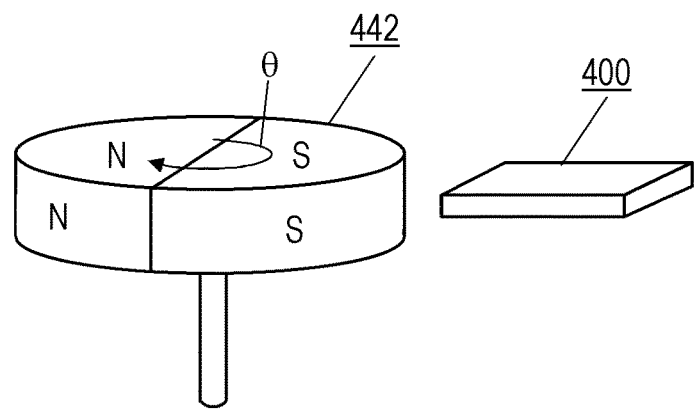
FIG. 19A is a perspective view of the magnetic sensor according to Embodiment 3 for illustrating an operation thereof.
Figure 19B:
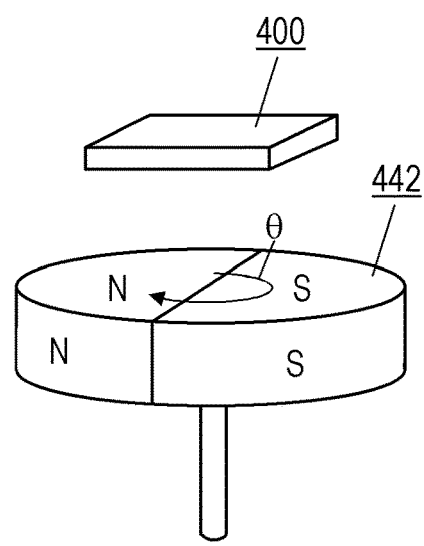
FIG. 19B is a perspective view of the magnetic sensor according to Embodiment 3 for illustrating another operation thereof.

FIGS. 19A and 19B show an operation of magnetic sensor 400. In FIG. 19A, magnetic sensor 400 is disposed by the lateral side of object magnet 442. In FIG. 19B, magnetic sensor 400 is disposed above object magnet 442.

Object magnet 442 shown in FIGS. 19A and 19B is rotatable; however, the magnet may be configured in another way. For example, object magnet 442 may made of a linear plate having N-poles and S-poles alternately disposed.

As shown in FIGS. 19A and 19B, magnetic sensor 400 is disposed to be movable relatively in a direction from the N-pole to the S-pole (or, from the S-pole to the N-pole) of object magnet 442. Specifically, magnetic sensor 400 and object magnet 442 are disposed such that the rotation of magnet 442 causes one of the poles of magnet 442 to alternatively change place with the other between the N-pole and the S-pole at the position where the poles alternatively pass either above magnetic sensor 400 or on a side of the magnetic sensor. Magnetic sensor 400 has a resistance which changes in accordance with the intensity of a magnetic field in a specific direction, for example. Accordingly, magnetic sensor 400 can detect changes in magnetic resistance corresponding to the changes from the N-pole to the S-pole and the changes from the S-pole to the N-pole. This configuration allows the rotation angle of an object including object magnet 442.

In magnetic sensor 400 according to Embodiment 3, for example, the direction of the magnetic bias applied to magnetoresistive element 302 by magnet 305 is shifted by an angle of 90 degrees with respect to the direction of the magnetic bias applied to magnetoresistive element 303 by magnet 306. Magnetoresistive elements 302 and 303 have output characteristics corresponding to the changes from the N-pole to the S-pole and the changes from the S-pole to the N-pole of object magnet 442 (such outputs are characteristics in terms of changes in resistances; the horizontal axis represents time; the vertical axis represents the changes in resistance). The output characteristics of the magnetoresistive elements are expressed as a sine wave (sin θ) and a cosine wave (cosθ). This is because the directions of the magnetic fields applied to the magnetoresistive elements from object magnet 442 are shifted with respect to each other by the angle of 90 degrees. Then, a tangent (tan θ) is calculated from the sine wave and the cosine wave to calculate rotation angle θ. The rotation angle of the object can be thus detected.

As shown in FIGS. 17 and 18, the magnetoresistive element group preferably further includes magnetoresistive element 304 while the magnet group preferably further includes magnet 307 corresponding to magnetoresistive element 304. As shown FIGS. 17 and 18, in a plan view (viewing from above), magnetoresistive elements 303 and 304 are preferably disposed symmetrically to each other with respect to axis L401 while magnetoresistive element 302 is preferably disposed on axis L401. Magnetoresistive element 302 is preferably coupled with voltage-input pad 311, ground pad 312, and output terminals 313 and 316. Magnetoresistive element 303 is preferably coupled with voltage-input pad 311, ground pad 312, and output terminal 314. Magnetoresistive element 304 is preferably coupled with voltage-input pad 311, ground pad 312, and output terminal 315. Magnetoresistive element 304 is coupled indirectly with ground pad 312 via magnetoresistive element 302 or 303. This configuration secures reliability of a sensing function of magnetic sensor 400, as described later.

An operation of magnetic sensor 400 for detecting object magnet 442 will be described below. First, output V1 and output V4, which are characteristics to indicate a change in the resistance of magnetoresistive element 302 are expressed with rotation angle θ of object magnet 442 as Formula 1.

$$V1=V4=\sin\theta \quad \text{(Formula 1)}$$

When the direction of the magnetic bias of magnet 306 is shifted by an angle of 90 degrees with respect to the direction of the magnetic bias of magnet 305, output V2 which is the characteristics of changes in the resistance of magnetoresistive element 303 is expressed as Formula 2.

$$V2=\sin(\theta+90°)=\cos\theta \quad \text{(Formula 2)}$$

When the direction of the magnetic bias of magnet 307 is shifted by an angle of 180 degrees with respect to the direction of the magnetic bias of magnet 306, i.e. by an angle of −90 degrees with respect to the direction of the magnetic bias of magnet 305, output V3 which is the characteristics of changes in the resistance of magnetoresistive element 304 is expressed as Formula 3.

$$V3=\sin(\theta-90°)=-\cos\theta \quad \text{(Formula 3)}$$

Difference V12 between outputs V1 and V2 is expressed as Formula 4.

$$V12=V1-V2=\sin\theta-\cos\theta=\sqrt{2}\sin(\theta-45°) \quad \text{(Formula 4)}$$

On the other hand, difference V34 between outputs V3 and V4 is expressed as Formula 5.

$$V34=V4-V3=\sin\theta-(-\cos\theta)=\sqrt{2}\sin(\theta+45°) \quad \text{(Formula 5)}$$

Difference V12 and difference V34 shift in phase with respect to each other at an angle of 90 degrees. Therefore, in that case where difference V12 changes along a sine wave, difference V34 changes along a cosine wave. A tangent (tan θ) is calculated from the sine wave and the cosine wave to calculate rotation angle θ. The rotation angle of the object can thus be detected.

A planar structure and a cross-sectional structure of the magnetoresistive elements of magnetic sensor 400 according to Embodiment 3 will be described below. In addition, the direction of a magnetic bias of each of the magnets constituting the magnet group will be also described.

Figure 20A:
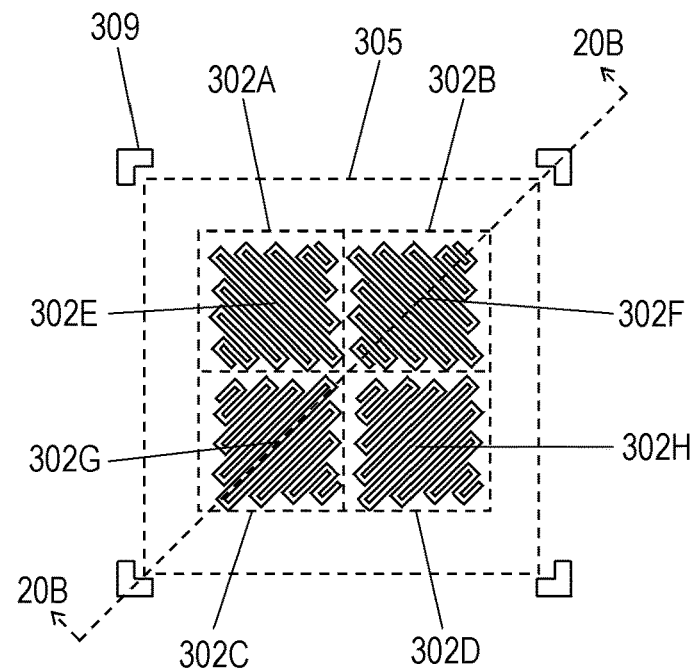
FIG. 20A is an enlarged view of a magnetoresistive element according to Embodiment 3.
Figure 20B:
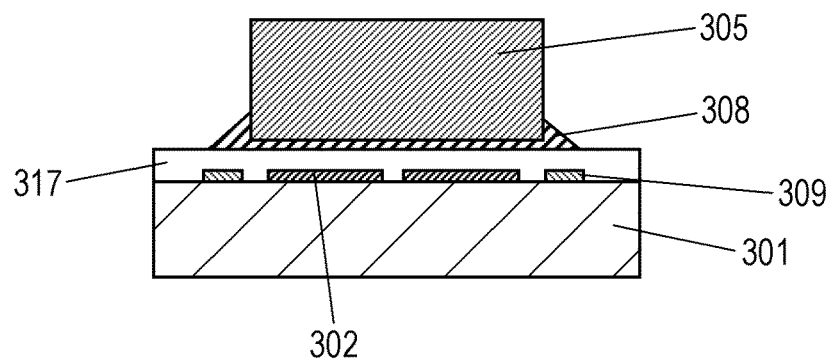
FIG. 20B is a cross-sectional view of the magnetoresistive element along line 20B-20B shown in FIG. 20A.
Figure 21A:
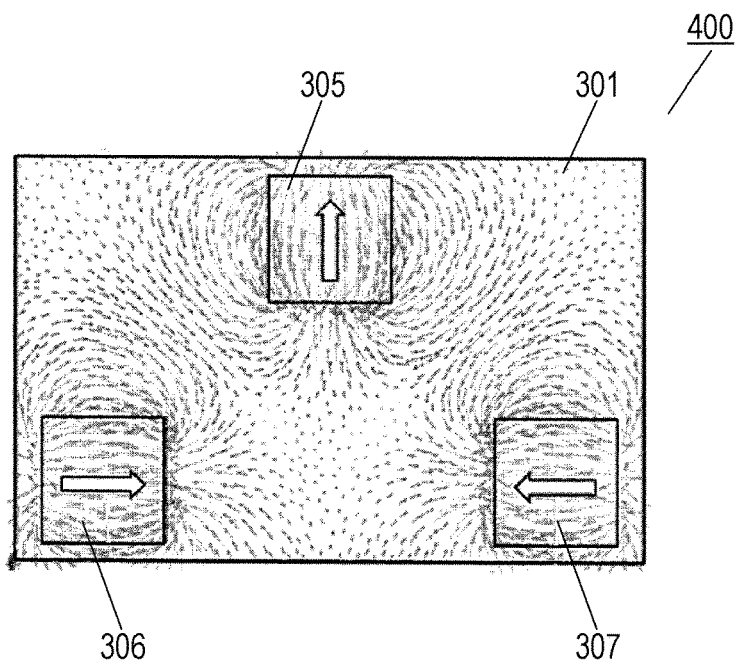
FIG. 21A illustrates a magnetic bias of each magnet of the magnetic sensor according to Embodiment 3.
Figure 21B:
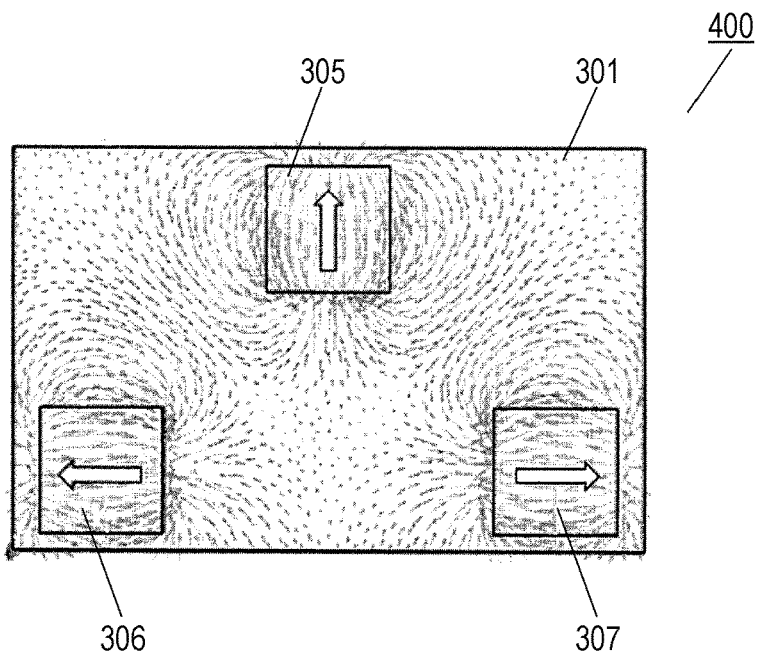
FIG. 21B illustrates another magnetic bias of each magnet of the magnetic sensor according to Embodiment 3.

FIG. 20A is an enlarged top view of magnetoresistive element 302. FIG. 20B is a cross-sectional view of magnetoresistive element 302 along line 20B-20B shown in FIG. 20A. FIG. 21A illustrates the direction of a magnetic bias of each of the magnets constituting the magnet group. FIG. 21B illustrates the direction of another magnetic bias of each of the magnets constituting the magnet group.

As shown in 20A, magnetoresistive element 302 includes patterns 302A, 302B, 302C, and 302D having meandering shapes. Each meandering shape includes plural straight parts and plural turning parts each connecting respective pair of straight parts. As shown in FIG. 20A, pattern 302A includes straight part 302E that is the longest among all the plural straight parts of the meandering shape. Pattern 302B includes straight part 302F that is the longest among all the straight parts of the meandering shape. Pattern 302C includes straight part 302G that is the longest among all the straight parts of the meandering shape. Pattern 302D includes straight part 302H that is the longest among all the straight parts of the meandering shape. Straight parts 302E and 302F extend in parallel with each other. Straight parts 302F and 302G extend while being shifted with respect to each other by an angle of 90 degrees. Straight parts 302G and 302H extend in parallel with each other. As shown in FIGS. 20A, 21A, and 21B, each of straight parts 302E, 302F, 302G, and 302H inclines at an angle of 45 degrees with respect to the direction of the magnetic bias of magnet 305. The relation between each of the patterns of other magnetoresistive elements 303 and 304 and the corresponding one of magnets 306 and 307, which respectively correspond to magnetoresistive elements 303 and 304, is identical to the relation between the pattern of magnetoresistive element 302 and magnet 305 which corresponds to magnetoresistive element 302. This configuration secures a reliability of the sensing function of magnetic sensor 400.

As shown in 20A, positioning parts 309 are preferably disposed on upper surface 301a of substrate 301 corresponding to corners of magnet 305. Upon being displaced, magnet 305 causes a directional deviation of the magnetic bias applied by magnet 305, possibly reducing reliability. Magnet 305 can be positioned and disposed while the positional relation between the corners of magnet 305 and positioning parts 309 is checked with, e.g. an optical microscope. This prevents the occurrence of a possible positional deviation of magnet 305, increasing the reliability. Positioning parts 309 are preferably made of metal. The material of positioning parts 309 is preferably identical to that of wires 310 extending from the magnetoresistive element group. This configuration allows positioning parts 309 to be formed by the same process for forming wires 310, thus being preferable in view of manufacturing costs. The above description regarding magnet 305 is applicable to other magnets 306 and 307.

As shown in FIG. 20B, magnet 305 is preferably disposed on magnetoresistive element 302 via adhesive 308, such as a thermosetting adhesive or an ultraviolet (UV) curable adhesive. Adhesive 308 preferably covers a part of side surfaces of magnet 305. Upon being displaced, magnet 305 causes a directional deviation of the magnetic bias applied by magnet 305, possibly reducing reliability. Hence, adhesives 308 which is not cured is firstly applied onto magnet 305 and the position of magnet 305 is checked. After the check, adhesive 308 which is not cured is cured. These processes prevents magnet 305 from being displaced, hence enhancing reliability. The above description regarding magnet 305 is applicable to other magnets 306 and 307.

As shown in FIG. 20B, protection film 317 made of a silicone oxide film or a fluorine-based resin film is disposed on the magnetoresistive element group. Adhesive 308 may be applied directly onto the magnetoresistive element group. However, protection film 317 between adhesive 308 and the magnetoresistive element group secures reliability of magnetic sensor 400.

Each of the magnetoresistive elements constituting the magnetoresistive element group is preferably made of an artificial lattice film which includes a magnetic layer containing Ni, Co, and Fe and a non-magnetic layer containing Cu stacked on the magnetic layer. Each of the magnetoresistive elements is preferably an anisotropic magnetoresistive element having a resistance changing in accordance with the intensity of a magnetic field in a specific direction.

The magnetoresistive element group may be disposed on substrate 301 via a base film made of, e.g. a silicone oxide film.

As shown in FIGS. 21A and 21B, the magnetic field at the center of magnet 305 is preferably parallel with the magnetic field at the center of magnet 306 while the magnetic field at the center of magnet 307 is preferably perpendicular to the magnetic field at the center of magnet 305. In FIGS. 21A and 21B, the arrow shown in each of the magnets indicates the direction of the magnetic field. Magnets 305 to 307 are preferably disposed away from each other by a sufficient distance to avoid interference among the magnetic fields caused by magnets 305, 306, and 307. This configuration allows magnetic sensor 400 to detect rotation angle θ of the object accurately.

As shown in FIG. 21A, the magnetic field at the center of magnet 307 faces the magnetic field at the center of magnet 306. Alternatively, as shown in FIG. 21B, the magnetic field at the center of magnet 307 may be directed toward the outside while the magnetic field at the center of magnet 306 may be directed toward the outside. To obtain the magnetic fields shown in FIG. 21A, magnets 305 to 307 are magnetized individually. In contrast, to obtain the magnetic fields shown in FIG. 21B, magnets 305 to 307 are magnetized at once.

Figure 22:
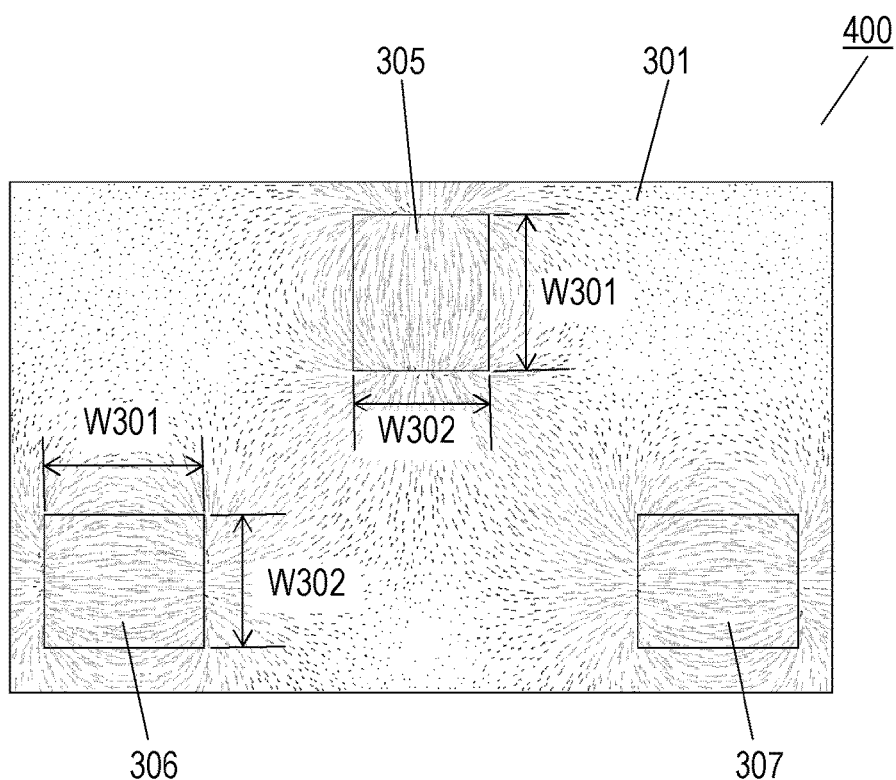
FIG. 22 illustrates a magnet group of the magnetic sensor according to Embodiment 3.

FIG. 22 illustrates the magnet group of magnetic sensor 400. As shown in FIG. 22, magnets 305, 306, and 307 preferably have rectangular parallelepiped shapes having rectangular surfaces. In magnetic sensor 400 shown in FIG. 22, each of magnets 305, 306, and 307 has rectangular surface having long sides with length W301 of 0.7 mm and short sides with length W302 of 0.6 mm. This configuration provides the following advantageous effects.

One effect is that markers to indicate the directions of magnetization are not necessary, hence reducing costs.

Another effect is that permeance modulus of each bias magnet increases, accordingly improving heat-resisting properties of the magnet.

Still another effect is that the large permeance modulus of each bias magnet increases the amount of surface magnetic fluxes, accordingly increasing the intensity of the bias magnetic field.

In the magnetic sensor disclosed in PTL 3, the detection sensitivity of magnetoresistive elements decreases when the intensity of an external magnetic field becomes excessively high. This magnetic sensor can be used only in an environment where the external magnetic field has a small intensity.

A magnetic field having an excessively high intensity may decrease a detection sensitivity of the magnetoresistive element. Hence, the intensity of a signal magnetic field applied to magnetic sensor 400 is preferably regulated.

Figure 23A:
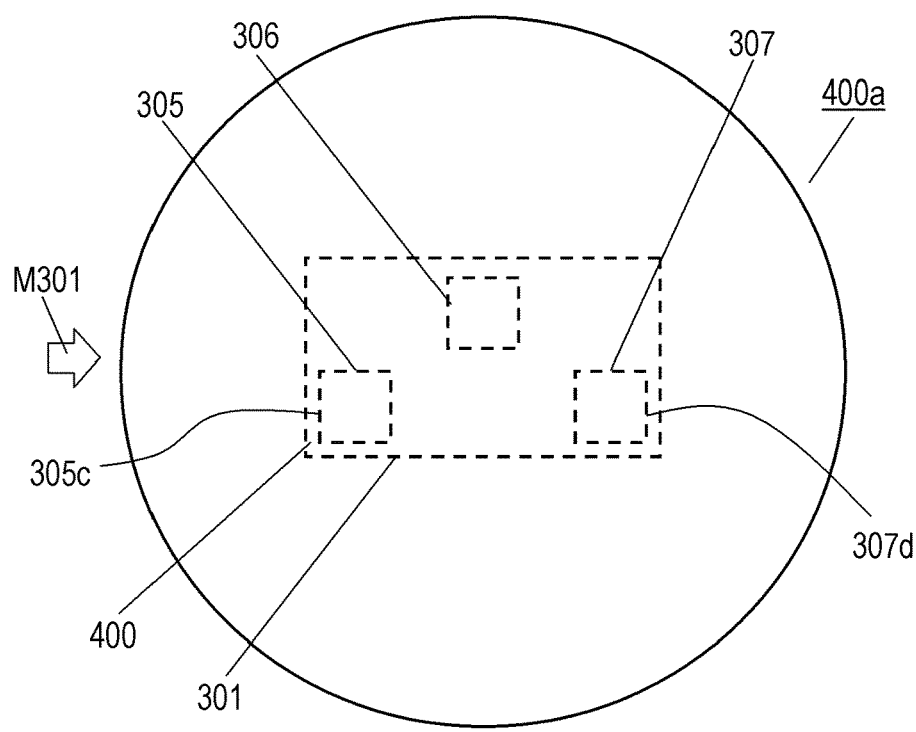
FIG. 23A is a top view of another magnetic sensor according to Embodiment 3.
Figure 23B:
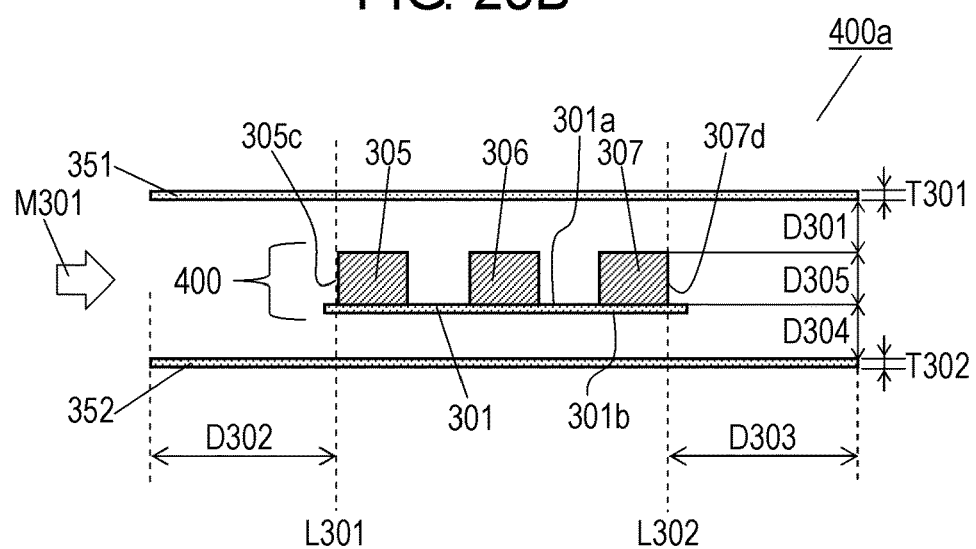
FIG. 23B is a side view of the magnetic sensor shown in FIG. 23A.

FIGS. 23A and 23B are a top view and a side view of another magnetic sensor 400a according to Embodiment 3, respectively. In FIGS. 23A and 23B, components identical to those of magnetic sensor 400 shown in FIGS. 17 to 22 are denoted by the same numerals. Magnetic sensor 400a further includes metal layers 351 and 352 to regulate the intensity of a signal magnetic field applied to magnetic sensor 400a.

Metal layer 351 is made of, e.g. a silicon steel plate. Metal layer 351 covers magnetic sensor 400 viewing from above.

Signal magnetic field M301 parallel with upper surface 301a and lower surface 301b of substrate 301 is applied to magnetic sensor 400a. The applied signal magnetic field flows into side surface 305c of magnet 305, reaches magnet 307, and then flows out from side surface 307d of magnet 307. Side surface 307d of magnet 307 is located on the opposite side of side surface 305c of magnet 305 of the magnet group, and faces the direction opposite the direction faced by side surface 305c of magnet 305. Metal layer 351 is preferably disposed at least between line L301 extending from side surface 305c of magnet 305 and line L302 extending from side surface 307d of magnet 307.

Metal layer 351 is substantially parallel with signal magnetic field M301.

Metal layer 351 has a lower surface that faces the upper surfaces of magnets 305 to 307. The lower surface of metal layer 351 is away from the upper surface of magnet 305, 306, or 307 by distance D301.

The side surface of metal layer 351 located in a direction to which signal magnetic field M301 flows in is away from side surface 305c of magnet 305 by distance D302.

The side surface of metal layer 351 located in a direction from which signal magnetic field M301 flows out is away from side surface 307d of magnet 307 by distance D303.

Metal layers 352 is made of, e.g. a silicon steel plate.

Metal layers 352 covers magnetic sensor 400 viewing from above.

Metal layer 352 is preferably disposed at least between line L301 and line L302.

Metal layer 352 is substantially parallel with signal magnetic field M301.

Metal layer 352 has an upper surface that faces the lower surfaces of magnets 305 to 307. The upper surface of metal layer 352 is away from the lower surface of magnet 305, 306, or 307 by distance D304.

The side surface of metal layer 352 located in a direction from which signal magnetic field M301 flows in is away from side surface 305c of magnet 305 by distance D302.

The side surface of metal layer 352 located in the direction from which signal magnetic field M301 flows out is away from side surface 307d of magnet 307 by distance D303.

The upper surface of magnet 305 is away from the lower surface of magnet 305 by distance D305. Alternatively, the upper surface of magnet 306 is away from the lower surface of magnet 306 by distance D305. Still alternatively, the upper surface of magnet 307 is away from and the lower surface of magnet 307 by distance D305.

A side surface of metal layer 351 located in the direction from which signal magnetic field M301 flows in extends beyond side surface 305c of magnet 305 located in the direction from which signal magnetic field M301 flows in. A side surface of metal layer 352 located in the direction from which signal magnetic field M301 flows in extends beyond side surface 305c of magnet 305 located in the direction from which signal magnetic field M301 flows in. This configuration shapes signal magnetic field M301 between metal layers 351 and 352 by reaching magnetic sensor 400a, thereby allowing signal magnetic field M301 to be detected accurately.

Distance D301 is preferably equal to distance D304, hence reducing angular errors of the signal magnetic field input to the magnetoresistive elements.

Distances D301, D304, and D305 are preferably equal to one another, hence reducing angular errors of the signal magnetic field input to the magnetoresistive elements.

Thickness T301 of metal layer 351 is preferably substantially equal to thickness T302 of metal layer 352, hence allowing uniform signal magnetic fields to be input to magnetic sensor 400a.

Figure 24A:
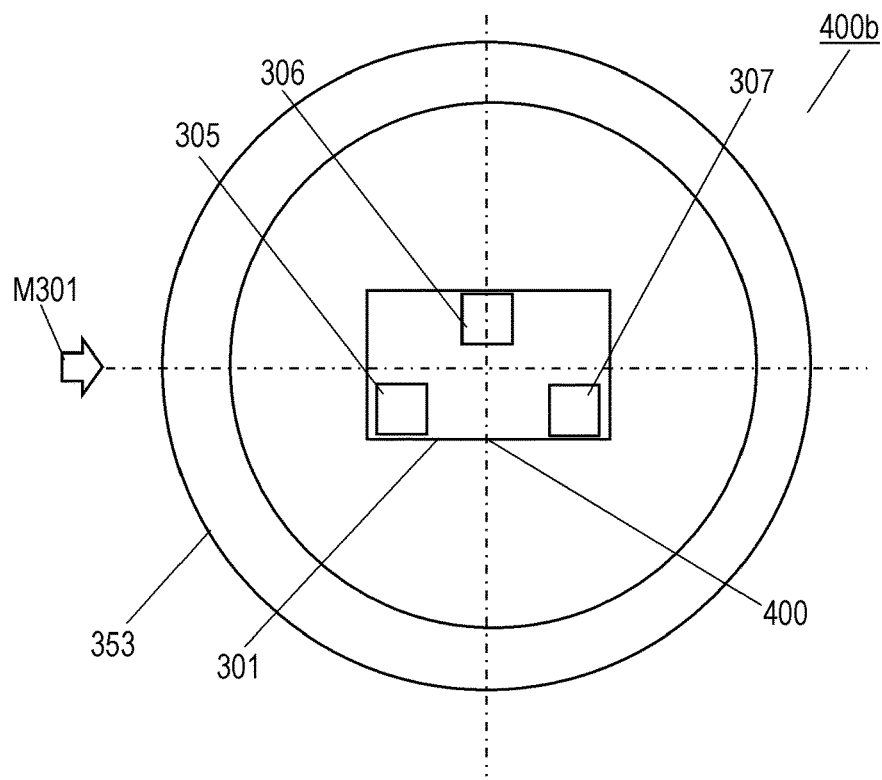
FIG. 24A is a top view of still another magnetic sensor according to Embodiment 3.
Figure 24B:
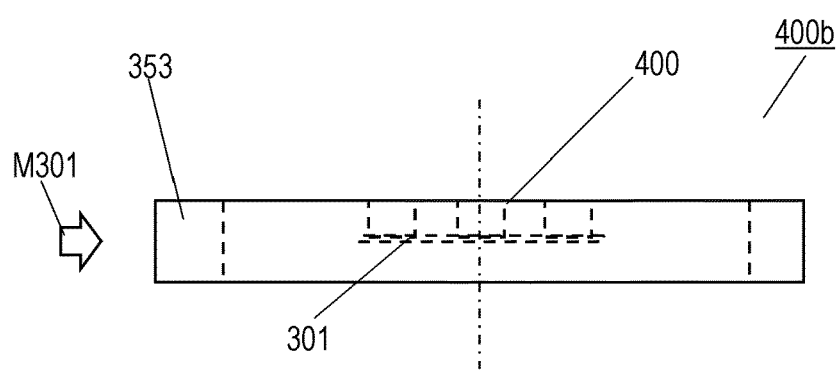
FIG. 24B is a side view of the magnetic sensor shown in FIG. 24A.

FIGS. 24A and 24B are a top view and a side view of still another magnetic sensor 400b according to Embodiment 3, respectively. In FIGS. 24A and 24B, components identical to those of magnetic sensor 400 shown in FIGS. 17 to 22 are denoted by the same numerals. Magnetic sensor 400b further includes metal layer 353 to regulate the intensity of signal magnetic field M301 applied to magnetic sensor 400 shown in FIGS. 17 to 22.

Metal layer 353 is made of, e.g. a silicon steel plate.

Metal layer 353 surrounds substrate 301 viewing from above. In other words, metal layer 353 has an annular shape viewing from above.

Metal layers 353 is substantially parallel with signal magnetic field M301.

As shown in FIGS. 24A and 24B, viewing from side, the upper surface of magnetic sensor 400 shown in FIGS. 17 to 22 is more preferably disposed at an inner portion of metal layers 353 than on the upper surface of metal layers 353. Similarly, viewing from side, the lower surface of magnetic sensor 400 is more preferably disposed at an inner portion of metal layer 353 than on the lower surface of metal layers 353. That is, viewing from side, magnetic sensor 400 preferably overlaps metal layer 353 such that the sensor does not protrude from metal layer 353. This configuration can prevent signal magnetic field M301 from expanding to the detection region of magnetic sensor 400b (400), and reduce angular errors of signal magnetic field M301.

Viewing from side, the upper surface of magnetic sensor 400 preferably overlaps the upper surface of metal layers 353. This configuration can reduce angular errors of the signal magnetic field input to the magnetoresistive elements.

Figure 25:
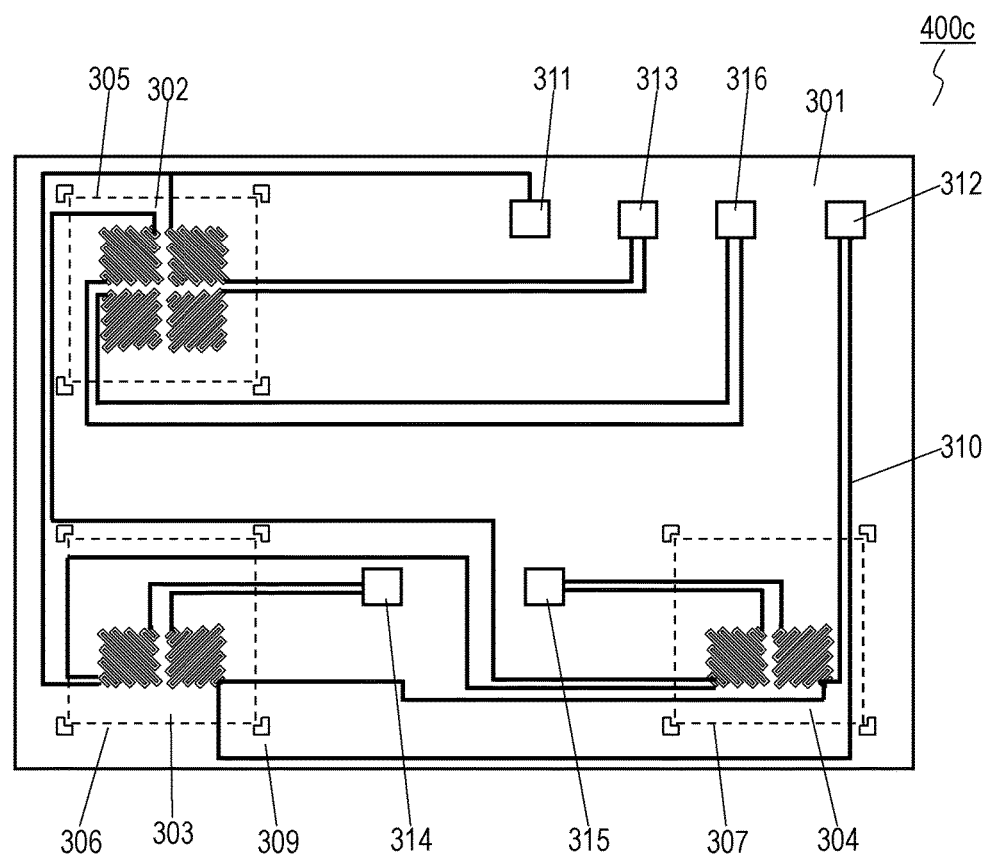
FIG. 25 is a top view of a further magnetic sensor according to Embodiment 3.

FIG. 25 is a top view of still another magnetic sensor 400c according to Embodiment 3. In FIG. 25, components identical to those of magnetic sensor 400 shown in FIGS. 17 to 22 are denoted by the same numerals. Magnetic sensor 400c shown in FIG. 25 is preferably used as magnetic sensors 400a and 400b including the metal layers shown in FIGS. 23A, 23B and 24A, and 24B. In magnetic sensor 400c, viewing from side, magnet 305 overlaps magnet 306, thereby allowing uniform signal magnetic fields to be input to the magnetoresistive elements.

Figure 26A:
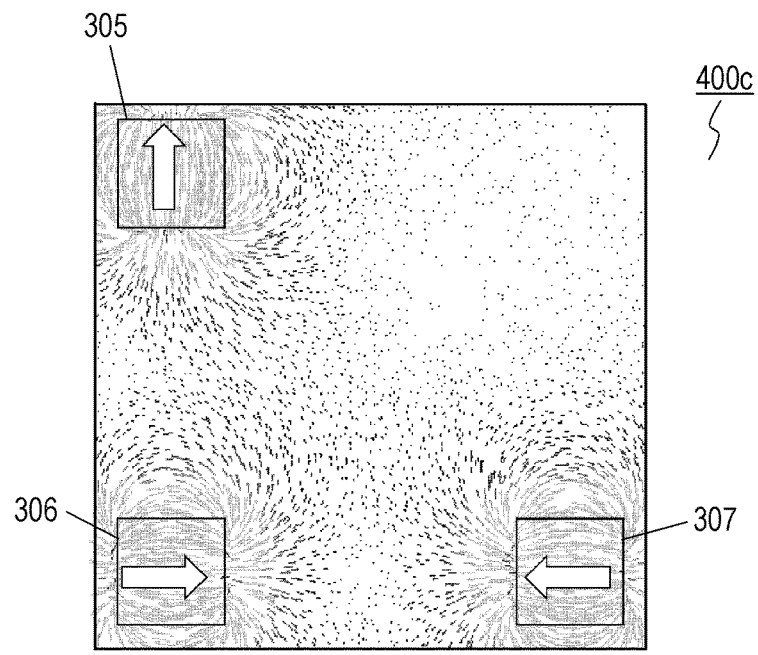
FIG. 26A illustrates an example of a magnetic bias direction of each magnet of the magnetic sensor shown in FIG. 25.
Figure 26B:
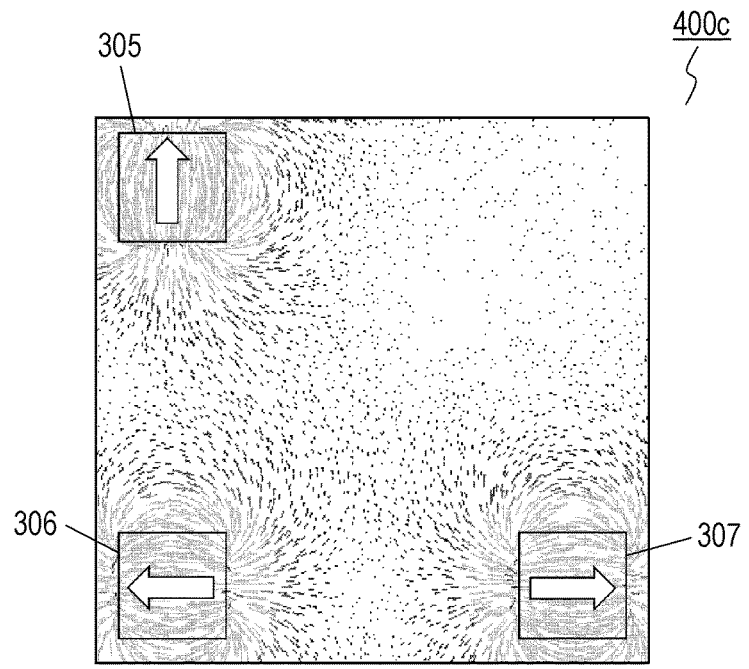
FIG. 26B illustrates another example of the magnetic bias direction of each magnet of the magnetic sensor shown in FIG. 25.

FIG. 26A illustrates an example of the direction of a magnetic bias of each of magnets of magnetic sensor 400c. FIG. 26B illustrates another example of the direction of the magnetic bias of each of the magnets of magnetic sensor 400c. In magnetic sensor 400c, as shown in FIGS. 26A and 26B, the magnetic field at the center of magnet 305 is preferably perpendicular to the magnetic field at the center of magnet 306 while the magnetic field at the center of magnet 307 is preferably parallel with the magnetic field at the center of magnet 306. The arrow shown in each of the magnets indicates the direction of the magnetic field. Magnets 305 to 307 are preferably disposed away from each other by a sufficient distance such that no interference occurs among the magnetic fields caused by magnets 305, 306, and 307. This configuration allows the rotation angle of the object to be detected accurately.

As shown in FIG. 26A, the magnetic field at the center of magnet 307 faces the magnetic field at the center of magnet 306. Alternatively, as shown in FIG. 26B, the magnetic field at the center of magnet 307 is directed toward the outside while the magnetic field at the center of magnet 306 is directed toward the outside. In order to obtain the magnetic fields shown in FIG. 26A, magnets 305 to 307 are magnetized individually. In contrast, in order to obtain the magnetic fields shown in FIG. 21B, magnets 305 to 307 can be magnetized at once.

Figure 27A:
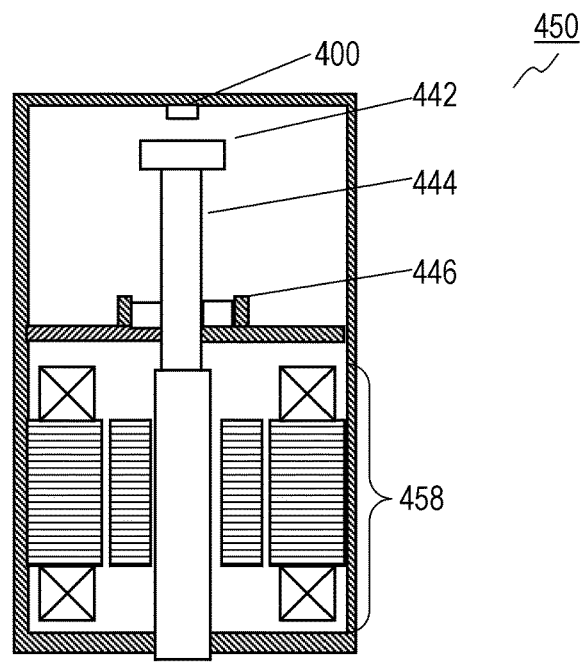
FIG. 27A is a schematic view of a rotation detecting unit including the magnetic sensor according to Embodiment 3.

FIG. 27A is a schematic view of rotation detecting unit 450 including magnetic sensor 400 according to Embodiment 3. Rotation detecting unit 450 includes magnetic sensor 400, object magnet 442, rotary shaft 444 to support object magnet 442, bearing 446 to support rotary shaft 444, and motor 458 to rotate rotary shaft 444. The operation of magnetic sensor 400 for detecting the rotation of object magnet 442 is described above.

Figure 27B:
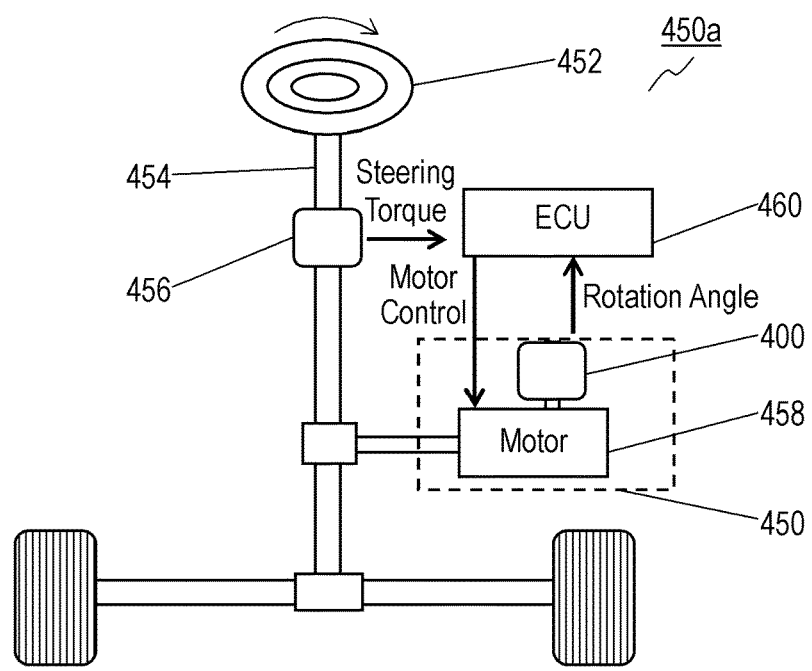
FIG. 27B is a schematic view of a control system including the rotation detecting unit according to Embodiment 3.

FIG. 27B is a schematic view of control system 450a including rotation detecting unit 450 according to Embodiment 3.

Control system 450a includes steering wheel 452, steering shaft 454, torque sensor 456, motor 458, magnetic sensor 400, and electronic control unit (ECU) 460. When a driver rotates steering wheel 452 so as to change a travelling direction of a vehicle, steering shaft 454 connected with the wheel rotates in a rotary direction identical to that of steering wheel 452. Torque sensor 456 detects a relative rotational displacement between an input shaft and an output shaft which is caused following the rotation of steering wheel 452, and then, transmits an electric signal of the detected displacement to ECU 460. Motor 458 assists the rotation of both steering wheel 452 and steering shaft 454. That is, the motor assists the rotation of steering wheel 452 and steering shaft 454 so as to allow the driver to easily change the travelling direction of the vehicle. Magnetic sensor 400 that detects the rotation angle of motor 458 is mounted to motor 458 so as to control motor 458.

A processing circuit to process the signals from the magnetoresistive element group is preferably disposed between magnetoresistive elements 303 and 304 and on upper surface 301a of substrate 301. The processing circuit can, for example, amplify the signals from the magnetoresistive element group. The processing circuit may be disposed in a hollow space between magnetoresistive elements 303 and 304, hence reducing the size of the entire of magnetic sensor 400.

The material of magnets 305, 306, and 307 preferably contains a resin and a rare-earth magnetic powder dispersed in the resin. The resin preferably contains a thermosetting resin. The rare-earth magnetic powder is preferably a magnetic powder of SmFeN. Because of its properties of being ease of resin molding, SmFeN has advantages in view of manufacturing processes. Alternatively, magnets 305 to 307 may be made of either a NdFeB (neodymium) magnet or a SmCo (samarium-cobalt) magnet.

As shown in FIG. 18, each of magnetoresistive elements 303 and 304 preferably has a smaller size than magnetoresistive element 302. Each of magnetoresistive elements 303 and 304 has a pattern with two meandering shapes while magnetoresistive element 302 has a pattern with four meandering shapes. However, each of magnetoresistive elements 303 and 304 may further include a dummy pattern with two meandering shapes, so that the number of the meandering shapes of each of magnetoresistive elements 303 and 304 is identical to the number of the meandering shapes of magnetoresistive element 302.

Exemplary Embodiment 4

Figure 28:
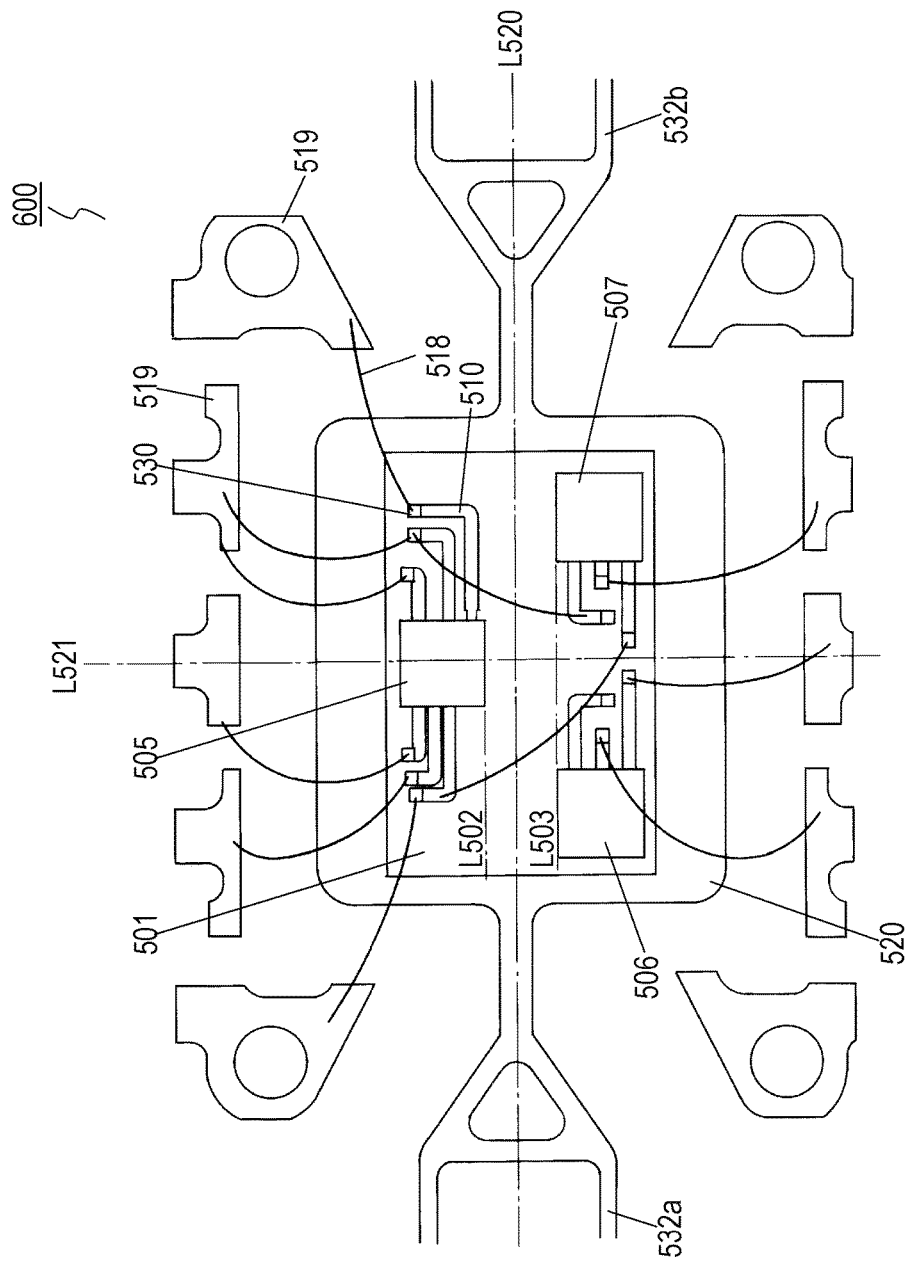
FIG. 28 is a schematic top view of a magnetic sensor according to Exemplary Embodiment 4.

FIG. 28 is a schematic top view of magnetic sensor 600 according to Exemplary Embodiment 4. As shown in FIG. 28, die pad 520 and substrate 501 including magnetoresistive elements are disposed on die pad 520. Pads 530 are disposed on substrate 501. Pads 530 include pads to drawn out outputs from the magnetoresistive elements, an input pad to apply a voltage to the magnetoresistive elements, and a pad to connect the magnetoresistive elements to the ground. A magnet group including magnets 505 and 506 is disposed on substrate 501.

Die pad 520 is supported by supporters 532a and 532b. Supporters 532a and 532b support both ends of die pad 520. Supporters 532a and 532b are disposed along straight line L520 that passes through the center of die pad 520. The magnet group preferably further includes magnet 507. Then, each of the pads of magnetic sensor 600 is electrically connected to respective one of external terminals 519 via wire 518.

Die pad 520 is made of metal. Die pad 520 is disposed on a ground pattern so as to eliminate external noises entering to an entire of magnetic sensor 600.

Figure 29:
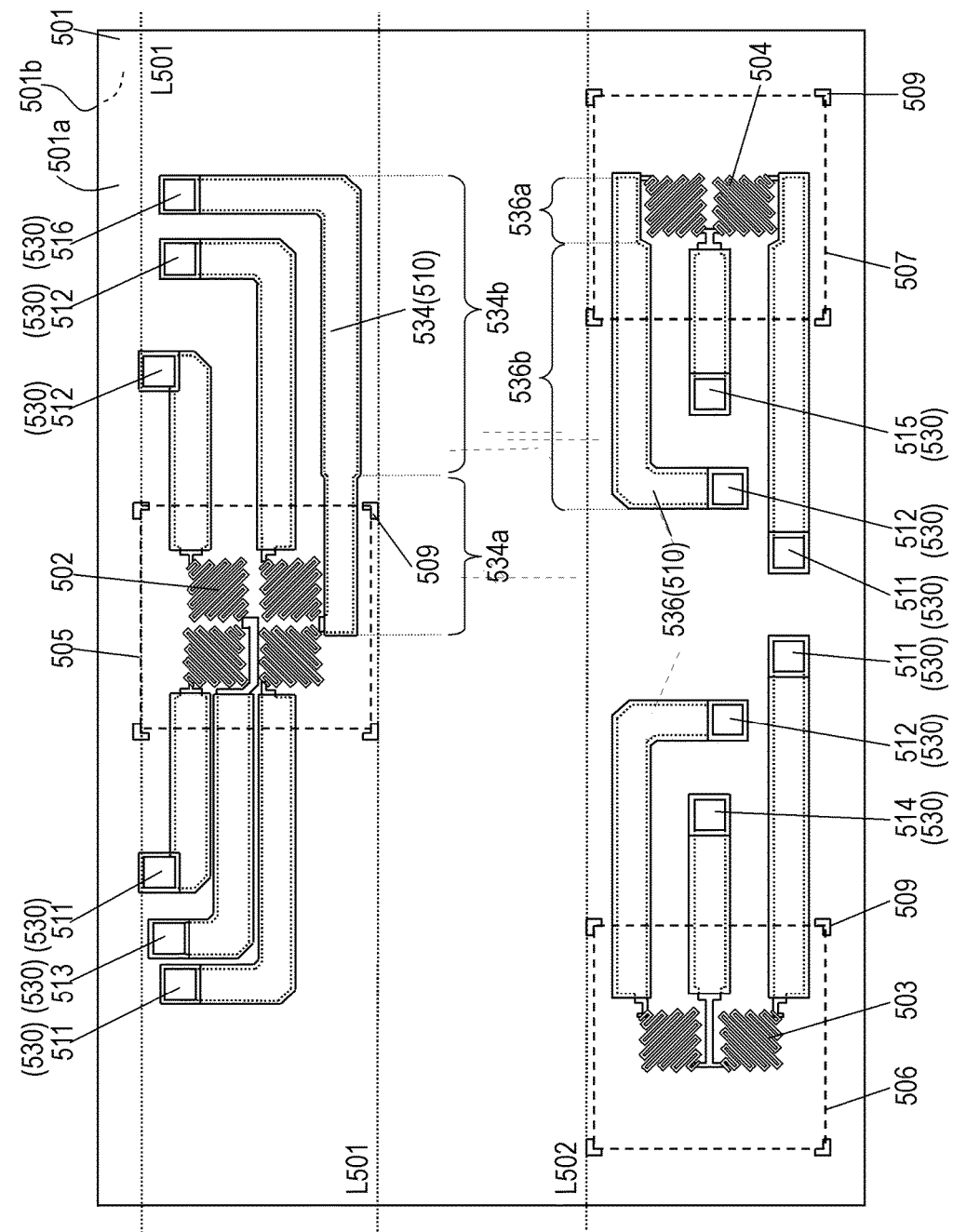
FIG. 29 is a schematic top view of a substrate of the magnetic sensor according to Embodiment 4.

FIG. 29 is a schematic top view of substrate 501 which includes the magnetoresistive elements disposed inside magnetic sensor 600. FIG. 29 focuses on patterns of the magnetoresistive elements disposed on substrate 501, patterns of wires, pads, etc. Regions in which the magnet group is disposed are indicated by dashed lines.

As shown in FIG. 29, magnetic sensor 600 includes substrate 501 having upper surface 501a and lower surface 501b, magnetoresistive elements 502 and 503 which are disposed on upper surface 501a of substrate 501, magnet 505 corresponding to magnetoresistive element 502, and magnet 506 corresponding to magnetoresistive element 503. Magnetoresistive elements 502 and 503 constitute a magnetoresistive element group. Magnets 505 and 506 constitute the magnet group. In magnetic sensor 600, magnets 505 and 506 can separately apply magnetic biases to magnetoresistive elements 502 and 503, respectively, that constitute the magnetoresistive element group. This configuration increases degree of freedom in the design as follows. That is, these magnets can apply not only magnetic biases having the same direction to magnetoresistive elements 502 and 503, but also magnetic biases having directions different from each other to magnetoresistive elements 502 and 503. This configuration provides the magnetic sensor with a small size and a high accuracy.

PTL 4 and PTL 5 disclose structures in which one bias magnet is disposed as a metal pattern that includes one or more magnetoresistive elements. This structure can hardly reduce the size and increase accuracy.

Wire 534 connecting magnetoresistive element 502 to the pad includes part 534a and part 534b. The width of part 534b is larger than that of part 534a. That is, wire 534 includes a wide part having a locally larger width. This configuration provides the following advantageous effects.

The wires connecting the magnetoresistive elements to the pads have different wire lengths in accordance with the positions of pads 530. For this reason, the wires have different resistances, i.e. wiring resistances, for different wirings. The different wiring resistances for different wirings may cause offsets in detection outputs, possibly reducing accuracy of magnetic sensor 600. Hence, magnetic sensor 600 uses a combination of different wires having different widths, thereby reducing the differences in resistance of the wires. This configuration reduces the offsets in the detection outputs, thereby increasing accuracy of magnetic sensor 600. In order to reduce the offset in the detection outputs, lengths or areas of wires for the input power is preferably substantially identical to those of wires for the ground. For example, one of a length and area of the wire between magnetoresistive element 502 and voltage-input pad 511 is preferably substantially equal to that of the wire between magnetoresistive element 502 and ground pad 512.

The larger the length of the wiring, the greater the wiring resistance is. Therefore, the longer wire (wire 534 shown in FIG. 29) preferably includes part 534b (a wide part) to reduce the wire resistance.

The position at which part 534b (wide part) is disposed is preferably closer to pad 530 than positioning part 509. That is, part 534b (wide part) is disposed at the position which does not overlap magnet 505 viewing from above. That is, part 534a is disposed at a position which overlaps magnet 505 viewing from above. This configuration reduces the size of the magnet, hence reducing the size of magnetic sensor 600.

In wire 536, part 534a is disposed at a position facing magnetoresistive element 504, in other words, at a position along magnetoresistive element 504. This configuration allows both wire 536 and magnetoresistive element 504 to have small sizes, reducing the size of magnetic sensor 600.

The pads out of pads 530 on upper surface 501a of substrate 501 which connect magnetoresistive element 502 are disposed along virtual line L501. This configuration facilitates wire bonding. In FIG. 29, the pads connected to magnetoresistive elements 503 and 504 are disposed not on a straight line; however, the pads connected to magnetoresistive elements 503 and 504 may be disposed along a virtual line.

Pads 530 are not disposed between virtual line L501 that passes through positioning parts 509 for magnet 505 and virtual line L502 that passes through positioning parts 509 for magnet 506. That is, magnets 505 and 506 are disposed at positions out of the center of substrate 501. Pads 530 are not disposed between magnets 505 and 506. This configuration allows devices, such as a circuit substrate, be disposed at and around the center on substrate 501. Pads 530 are disposed around substrate 501, hence facilitating wire bonding.

Figure 30A:
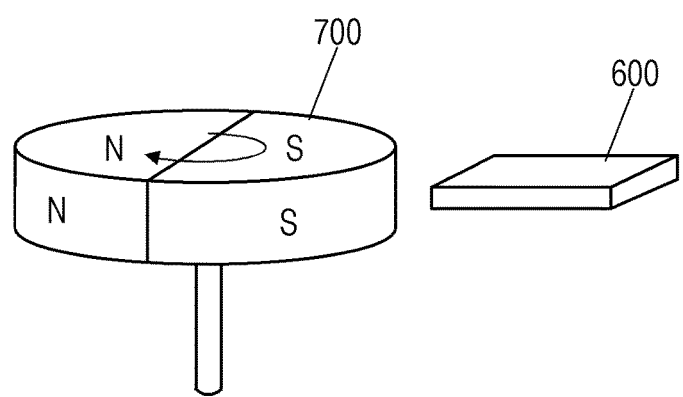
FIG. 30A is a perspective view of the magnetic sensor according to Embodiment 4 for illustrating an operation thereof.
Figure 30B:
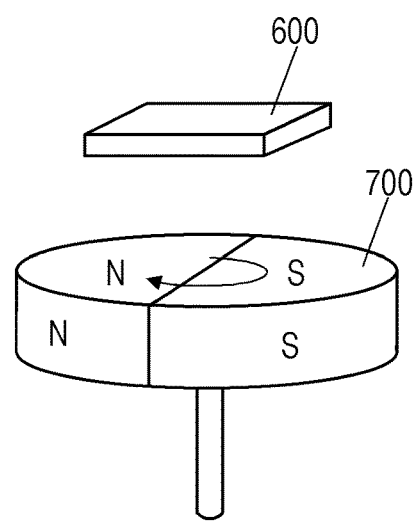
FIG. 30B is a perspective view of the magnetic sensor according to Embodiment 4 for illustrating another operation thereof.

An operation of magnetic sensor 600 will be described below. FIG. 30A illustrates magnetic sensor 600 disposed at the lateral side of object magnet 700. FIG. 30B illustrates magnetic sensor 600 disposed above object magnet 700. Object magnet 700 shown in FIGS. 30A and 30B is rotatable; however, the magnet may be configured in another way. For example, object magnet 700 may be a linear plate having N-poles and S-poles alternately arranged.

As shown in FIGS. 30A and 30B, magnetic sensor 600 is movable relatively in the direction from the N-pole to the S-pole (or, from the S-pole to the N-pole) of the object magnet. Specifically, magnetic sensor 600 and object magnet 700 are disposed such that the rotation of magnet 700 causes one of the poles of magnet 700 to alternatively change place with the other, i.e. changes from the N-pole to the S-pole, changes from the S-pole to the N-pole, and so on, at the position where the poles alternatively pass either by the lateral side or above the upper side of magnetic sensor 600.

The magnetic sensor has a resistance that changes in accordance with the intensity of a magnetic field in a specific direction. Accordingly, magnetic sensor 600 can detect a change in magnetic resistance corresponding to the changes from the N-pole to S-pole and the changes from the S-pole to the N-pole. This operation allows the rotation angle of an object including object magnet 700 to be detected.

In magnetic sensor 600 according to Embodiment 4, the direction of the magnetic bias applied to magnetoresistive element 502 by magnet 505 is shifted by an angle of 90 degrees with respect to the direction of the magnetic bias applied to magnetoresistive element 503 by magnet 506, for example. Magnetoresistive elements 502 and 503 have output characteristics corresponding to the changes from the N-pole to the S-pole and the changes from the S-pole to the N-pole of object magnet 700. In this case, such output characteristics exhibit the changes in resistance which are expressed by a sine wave ($\sin \theta$) and a cosine wave ($\cos \theta$), respectively, with respect to rotation angle $\theta$ of object magnet 700. This is because the directions of the magnetic fields applied to magnetoresistive elements 502 and 503 by object magnet 700 are shifted with respect to each other by the angle of 90 degrees. Then, a tangent ($\tan \theta$) is calculated from the sine wave and the cosine wave to calculate rotation angle $\theta$. The rotation angle of the object is thus detected.

As shown in FIGS. 28 and 29, the magnetoresistive element group preferably further includes magnetoresistive element 504 while the magnet group preferably further includes magnet 507 that corresponds to magnetoresistive element 504. In a plan view (viewing from above), magnetoresistive elements 503 and 504 are preferably disposed symmetrically to each other with respect to axis L521, and magnetoresistive element 502 is preferably disposed on axis L521. Magnetoresistive element 502 is preferably connected to voltage-input pads 511, ground pads 512, output terminal 513, and output terminal 516. Magnetoresistive element 503 is preferably connected to voltage-input pad 511, ground pad 512, and output terminal 514. Magnetoresistive element 504 is preferably connected to voltage-input pad 511, ground pad 512, and output terminal 515. Magnetoresistive element 504 is connected indirectly to ground pad 512 via magnetoresistive element 502 or 503. This configuration can secure reliability of a sensing function of magnetic sensor 600, as described later.

An operation of magnetic sensor 600 for detecting the magnetic field of object magnet 700 will be described below. First, output V1 and output V4, which are characteristics to indicate changes in the resistance of magnetoresistive element 502 are expressed as Formula 6.

$$V1=V4=\sin\theta \quad \text{(Formula 6)}$$

When the direction of the magnetic bias of magnet 506 is shifted by an angle of 90 degrees with respect to the direction of the magnetic bias of magnet 505, output V2 which is the characteristics of changes in the resistance of magnetoresistive element 503 is expressed as Formula 7.

$$V2=\sin(\theta+90°)=\cos\theta \quad \text{(Formula 7)}$$

When the direction of the magnetic bias of magnet 507 is shifted by an angle of 180 degrees with respect to the direction of the magnetic bias of magnet 506, i.e. by an angle of −90 degrees with respect to the direction of the magnetic bias of magnet 505, output V3 which is the characteristics of changes in the resistance of magnetoresistive element 504 is expressed as Formula 8.

$$V3=\sin(\theta-90°)=-\cos\theta \quad \text{(Formula 8)}$$

Difference V12 between outputs V1 and V2 is expressed as Formula 9.

$$V12=V1-V2=\sin\theta-\cos\theta=\sqrt{2}\sin(\theta-45°) \quad \text{(Formula 9)}$$

Difference V34 between outputs V3 and V4 is expressed as Formula 10.

$$V34=V4-V3=\sin\theta-(-\cos\theta)=\sqrt{2}\sin(\theta+45°) \quad \text{(Formula 10)}$$

As a result, difference V12 and difference V34 are out of phase with respect to each other at an angle of 90 degrees. Therefore, in the case where difference V12 changes along a sine wave, difference V34 changes along a cosine wave. Then, tan θ is calculated from the sine wave and the cosine wave to calculate the rotation angle θ. The rotation angle of the object is thus detected.

A planar structure and a cross-sectional structure of the magnetoresistive elements of magnetic sensor 600 according to Embodiment 4 will be described below. In addition, the direction of a magnetic bias of each of the magnets constituting the magnet group will be described.

Figure 31A:
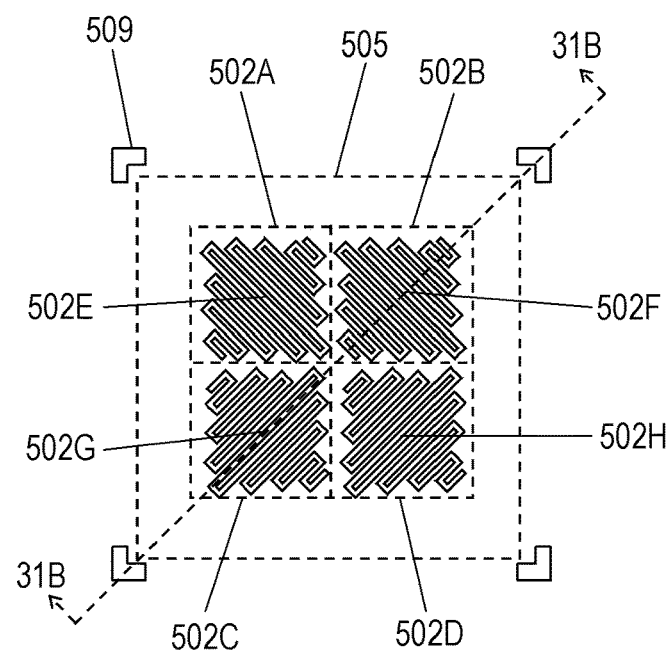
FIG. 31A is an enlarged view of a magnetoresistive element of the magnetic sensor according to Embodiment 4.
Figure 31B:
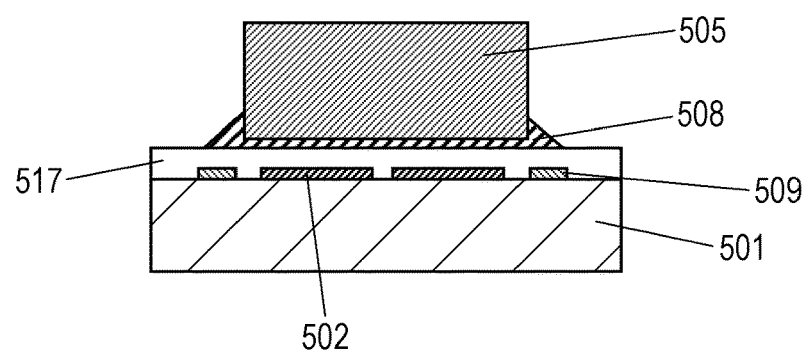
FIG. 31B is a cross-sectional view of the magnetoresistive element along line 31B-31B shown in FIG. 31A.
Figure 32A:
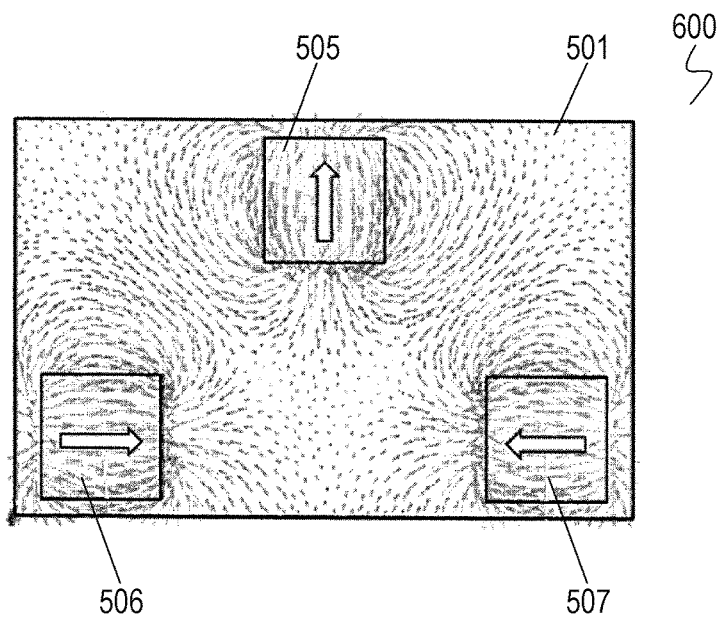
FIG. 32A illustrates a magnetic bias of each magnet of the magnetic sensor according to Embodiment 4.
Figure 32B:
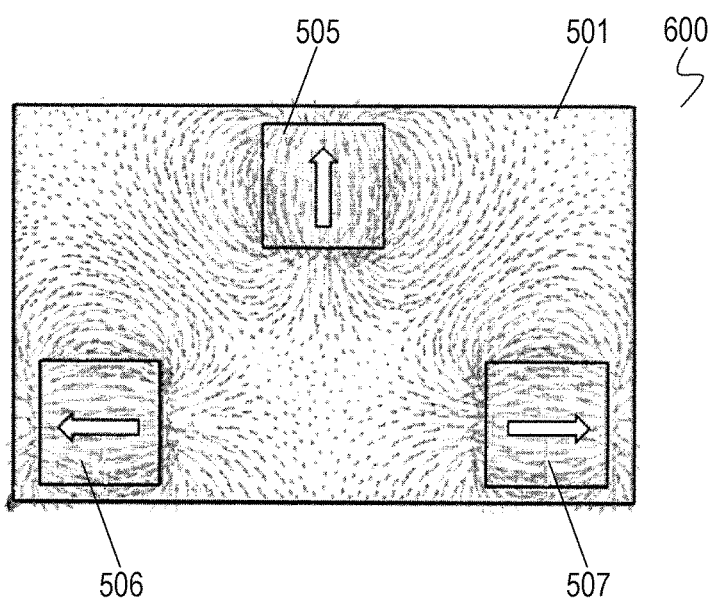
FIG. 32B illustrates another magnetic bias of each magnet of the magnetic sensor according to Embodiment 4.

FIG. 31A is an enlarged top view of magnetoresistive element 502. FIG. 31B is a cross-sectional view of magnetoresistive element 502 along line 31B-31B shown in FIG. 31A. FIG. 32A illustrates the direction of a magnetic bias of each of the magnets constituting the magnet group. FIG. 32B illustrates the direction of another magnetic bias of each of the magnets constituting the magnet group.

As shown in 31A, magnetoresistive element 502 includes patterns 502A, 502B, 502C, and 502D having meandering shapes. Each of the meandering shapes includes plural straight parts and plural turning parts each connecting respective pair of straight parts. As shown in FIG. 31A, pattern 502A includes straight part 502E that is the longest among the straight parts of the meandering shape. Pattern 502B includes straight part 502F that is the longest among the plural straight parts of the meandering shape. Pattern 502C includes straight part 502G that is the longest among the plural straight parts of the meandering shape. Pattern 502D includes straight part 502H that is the longest among the plural straight parts of the meandering shape. Straight parts 502E and 502F extend in parallel with each other. Straight parts 502F and 502G extend while being shifted with respect to each other by an angle of 90 degrees. Straight parts 502G and 502H extend in parallel with each other. As shown in FIGS. 31A, 32A, and 32B, straight parts 502E, 502F, 502G, and 502H incline at an angle of 45 degrees with respect to the direction of the magnetic bias of the magnet. The relation between each of the patterns of other magnetoresistive elements 503 and 504 and the corresponding one of magnets 506 and 507 which respectively correspond to magnetoresistive elements 503 and 504 is identical to the relation between the pattern of magnetoresistive element 502 and magnet 505 which corresponds to magnetoresistive element 502. This configuration secures reliability of the sensing function of magnetic sensor 600.

As shown in FIG. 31A, positioning parts 509 corresponding to corners of magnet 505 are preferably disposed on upper surface 501a of substrate 501. Upon being displaced, magnet 505 may cause a directional deviation of the magnetic bias applied by magnet 505, hence reducing reliability. Magnet 505 can be positioned and disposed while the positional relation between the corners of magnet 505 and positioning parts 509 is checked with, e.g. an optical microscope. This operation prevents the occurrence of a possible positional deviation of magnet 505, hence increasing reliability. Positioning parts 509 are preferably made of metal. The material of positioning parts 509 is preferably the identical to that of wires 510 (see FIGS. 28 and 29) which extend from the magnetoresistive element group. This configuration allows positioning parts 509 to be formed by the same process for forming wires 510, which is preferable in view of manufacturing costs. The above description for magnet 505 is applicable to magnets 506 and 507.

As shown in FIG. 31B, magnet 505 is preferably disposed on magnetoresistive element 502 via adhesive 508 made of, e.g. a thermosetting adhesive or a UV curable adhesive. Adhesive 508 preferably covers a part of the side surfaces of magnet 505. Upon being displaced, magnet 505 may cause a directional deviation of the magnetic bias applied by magnet 505, hence reducing reliability. Adhesive 508 which is not cured is firstly applied to magnet 505, and the position of magnet 505 is checked. After that, adhesive 508 which is not cured is then cured.

These processes can prevent magnet 505 from being displaced, hence increasing reliability. The above description for magnet 505 is applicable to other magnets 506 and 507.

As shown in FIG. 31B, protection film 517 made of a silicone oxide film or a fluorine-based resin film is disposed on the magnetoresistive element group. Adhesive 508 may be applied directly on the magnetoresistive element group. However, protection film 517 between adhesive 508 and the magnetoresistive element secures reliability of magnetic sensor 600.

Each of the magnetoresistive elements constituting the magnetoresistive element group is preferably made of an artificial lattice film including a magnetic layer containing Ni, Co, and Fe and a non-magnetic layer containing Cu stacked on the magnetic layer. Each of the magnetoresistive elements is preferably an anisotropic magnetoresistive element having a resistance which changes in accordance with the intensity of a magnetic field in a specific direction.

The magnetoresistive element group may be disposed on substrate 501 via a base film made of, e.g. a silicone oxide film.

As shown in FIGS. 32A and 32B, the magnetic field at the center of magnet 505 is preferably perpendicular to the magnetic field at the center of magnet 506 while the magnetic field at the center of magnet 506 is preferably parallel with the magnetic field at the center of magnet 506. In FIGS. 32A and 32B, the arrow shown in each of the magnets indicates the direction of the corresponding magnetic field. Magnets 505 to 507 are preferably disposed away from each other by a distance long enough to avoid interference among the magnetic fields caused by magnets 505, 506, and 507.

This configuration allows magnetic sensor 600 to detect the rotation angle of the object accurately.

As shown in FIG. 32A, the magnetic field at the center of magnet 507 faces the magnetic field at the center of magnet 506. Alternatively, as shown in FIG. 32B, the magnetic field at the center of magnet 507 is directed toward the outside while the magnetic field at the center of magnet 506 is directed toward the outside. In order to obtain the magnetic fields shown in FIG. 32A, magnets 505 to 507 are magnetized individually. In contrast, in order to obtain the magnetic fields shown in FIG. 32B, magnets 505 to 507 can be magnetized at once.

Figure 33:
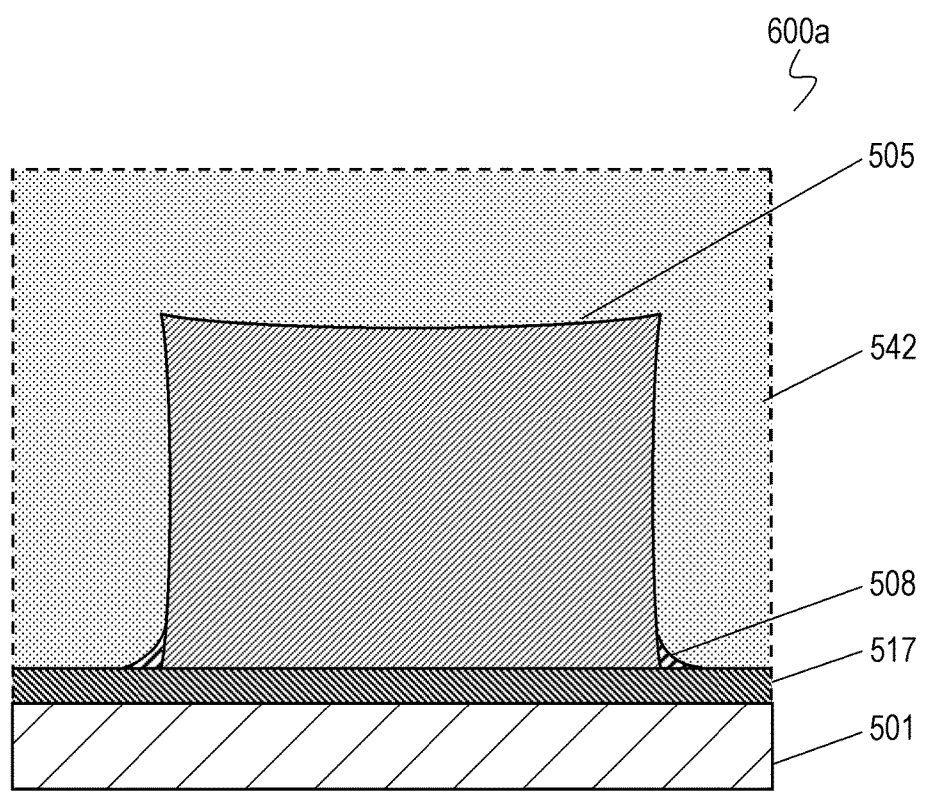
FIG. 33 is a cross-sectional view of another magnetic sensor according to Embodiment 4.

FIG. 33 is a cross-sectional view of another magnetic sensor 600a according to Embodiment 4. In FIG. 33, components identical to those of magnetic sensor 600 shown in FIGS. 31B are denoted by the same numerals. Magnetic sensor 600a shown in FIG. 33 further includes resin 542 which molds magnets 505, 506, and 507 so as to cover magnets 505, 506, and 507, thereby increasing reliability of magnetic sensor 600a.

Side surfaces of each of magnets 505, 506, and 507 are preferably concave in cross sections thereof. This configuration increases reliability of joining of resin 542 and magnet 505, or joining of adhesive 508 and magnet 505. All of the side surfaces of magnet 505 concave inward. At least one of the side surfaces of magnet 505 may be concave inward in the cross sections. Each of the concave side surfaces may be concave over the entire length of the side surfaces of the magnet or, alternatively, may be concave over parts of the side surfaces of the magnet.

A processing circuit to process signals from the magnetoresistive element group is preferably disposed between magnetoresistive elements 503 and 504 and on upper surface 501a of substrate 501. The processing circuit may, for example, amplify the signals from the magnetoresistive element group. The processing circuit can be disposed in a hollow space between magnetoresistive elements 503 and 504, hence reducing the size of the entire of magnetic sensor 600a.

The material of magnets 505, 506, and 507 preferably contains a resin and a rare-earth magnetic powder dispersed in the resin. The resin preferably contains a thermosetting resin. The rare-earth magnetic powder is preferably a magnetic powder of SmFeN. Because of its properties of being ease of resin molding, SmFeN has advantages in view of manufacturing processes.

As shown in FIG. 29, each of magnetoresistive elements 503 and 504 preferably has a smaller size than magnetoresistive element 502. Each of magnetoresistive elements 503 and 504 preferably has a pattern with two meandering shapes while magnetoresistive element 502 has a pattern with four meandering shapes. However, each of magnetoresistive elements 503 and 504 may further include a dummy pattern with two meandering shapes, so that the number of the meandering shapes of each of magnetoresistive elements 503 and 504 is identical to the number of the meandering shapes of magnetoresistive element 502.

Terms, such as "equal" and "identical", in the above description of the embodiments are not intended to mean "physically completely equal" and "physically completely identical," respectively. Therefore, these terms may be construed in a more practical manner. That is, the meanings of the terms "equal" and "identical" may practically include meanings of terms "containing a tolerance" and "containing a difference," although the tolerance and difference are small from a practical point of view.

In the embodiments, terms, such as "upper surface", indicating directions merely indicate relative directions depending only on relative positional relation of constituent components of the magnetic sensors, and do not indicate absolute directions, such as a vertical direction.

REFERENCE MARKS IN THE DRAWINGS 1 object
3 South-pole permanent magnet
4 North-pole permanent magnet
5 substrate (first substrate)
10 substrate (second substrate)
11a Hall element (first Hall element)
11ap detection axis (third detection axis)
11b Hall element (second Hall element)
11bp detection axis (fourth detection axis)
12a magnetoresistive element (first magnetoresistive element)
12ap detection axis (first detection axis)
12b magnetoresistive element (second magnetoresistive element)
12bp detection axis (second detection axis)
12c magnetoresistive element (third magnetoresistive element)
12cp detection axis (fifth detection axis)
12d magnetoresistive element (fourth magnetoresistive element)
12dp detection axis (sixth detection axis)
12e magnetoresistive element
12f magnetoresistive element
50 processor
51 processor
52 processor
62 terminal
67 magnetic medium
68 magnetic medium
69 die pad
99, 99a, 99b, 99c magnetic sensor
100, 200 magnetic sensor
101 substrate
102 input electrode
103 ground electrode
104 output electrode
105 output electrode
116 magnetoresistive element group
120, 220 magnetoresistive element
130, 230 magnetoresistive element
140, 240 magnetoresistive element
150, 250 magnetoresistive element
126a, 126b, 226a, 226b, 226c, 226d bent part
160 bias magnet
161 North-pole permanent magnet
162 South-pole permanent magnet
301 substrate
302 magnetoresistive element
303 magnetoresistive element
304 magnetoresistive element
305 magnet
306 magnet
307 magnet
308 adhesive
309 positioning part
310 wire
311 voltage-input pad
312 ground pad
313 output terminal 314 output terminal
315 output terminal
316 output terminal
317 protection film
351 metal layer
352 metal layer
353 metal layer
400, 400a, 400b, 400c magnetic sensor
501 substrate
502 magnetoresistive element
503 magnetoresistive element
504 magnetoresistive element
505 magnet
506 magnet
507 magnet
508 adhesive
509 positioning part
510 wire
511 voltage-input pad
512 ground pad
513 output terminal
514 output terminal
515 output terminal
516 output terminal
517 protection film
518 wire
519 external terminal
520 die pad
530 pad
532a, 532b supporter
542 resin
600, 600a magnetic sensor
700 object magnet

The invention claimed is:

1. A magnetic sensor, comprising:
   a first substrate including
      a first magnetoresistive element that detects a magnetic field along a first detection axis, and
      a second magnetoresistive element that detects a magnetic field along a second detection axis inclining at an angle of 45 degrees with respect to the first detection axis; and
   a second substrate including
      a first Hall element that detects a magnetic field along a third detection axis, and
      a second Hall element that detects a magnetic field along a fourth detection axis perpendicular to the third detection axis, wherein
   the first Hall element is disposed on a first virtual line passing substantially through a center of the first substrate, and
   the second Hall element is disposed on a second virtual line passing substantially through the center of the first substrate, the second virtual line being perpendicular to the first virtual line.

2. The magnetic sensor according to claim 1, further comprising a third magnetoresistive element that detects a magnetic field along a fifth detection axis inclining at an angle of 135 degrees with respect to the first detection axis.

3. The magnetic sensor according to claim 1, wherein
   the first substrate, the first Hall element, and the second Hall element are arranged in parallel with an upper surface of the second substrate, and
   the first Hall element and the second Hall element do not overlap the first substrate viewing from above.

4. The magnetic sensor according to claim 1, wherein
   the magnetic sensor is configured to detect a magnetic field generated by an object, and
   a distance from the first substrate to the object is smaller than a distance from the second substrate to the object.

5. The magnetic sensor according to claim 4, wherein the object comprises a magnet rotor.

6. The magnetic sensor according to claim 1, wherein the center of the first substrate is located between the first magnetoresistive element and the second magnetoresistive element.

7. The magnetic sensor according to claim 6, wherein the first magnetoresistive element and the second magnetoresistive element are located symmetrically to each other with respect to the first virtual line.

8. The magnetic sensor according to claim 7, wherein the first magnetoresistive element and the second magnetoresistive element are located away from the first virtual line.

9. The magnetic sensor according to claim 8, wherein the first magnetoresistive element and the second magnetoresistive element are arranged in parallel with the second virtual line.

10. The magnetic sensor according to claim 9, wherein the first magnetoresistive element and the second magnetoresistive element are arranged on the second virtual line.

11. The magnetic sensor according to claim 1, wherein the first magnetoresistive element and the second magnetoresistive element are located symmetrically to each other with respect to the first virtual line.

12. The magnetic sensor according to claim 1, wherein the first magnetoresistive element and the second magnetoresistive element are located away from the first virtual line.

13. The magnetic sensor according to claim 1, wherein the first magnetoresistive element and the second magnetoresistive element are arranged in parallel with the second virtual line.

14. The magnetic sensor according to claim 13, wherein the first magnetoresistive element and the second magnetoresistive element are arranged on the second virtual line.

15. The magnetic sensor according to claim 1, wherein the first substrate is dispose on an upper surface of the second substrate.

* * * * *